US012757675B2

(12) United States Patent
Lavdovsky et al.

(10) Patent No.: US 12,757,675 B2
(45) Date of Patent: Oct. 6, 2026

(54) RAPID AND PRECISE TEMPERATURE CONTROL FOR THERMAL ETCHING

(71) Applicant: Lam Research Corporation, Fremont, CA (US)

(72) Inventors: Nathan Lavdovsky, Beaverton, OR (US); Butch Berney, Pleasanton, CA (US); Mark Naoshi Kawaguchi, San Carlos, CA (US); Ji Zhu, Castro Valley, CA (US); Hongbo Si, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 899 days.

(21) Appl. No.: 17/995,032

(22) PCT Filed: Mar. 23, 2021

(86) PCT No.: PCT/US2021/023701

§ 371 (c)(1),
(2) Date: Sep. 29, 2022

(87) PCT Pub. No.: WO2021/202171

PCT Pub. Date: Oct. 7, 2021

(65) Prior Publication Data

US 2023/0131233 A1 Apr. 27, 2023

Related U.S. Application Data

(60) Provisional application No. 63/003,721, filed on Apr. 1, 2020.

(51) Int. Cl.

*H10P 72/00* (2026.01)
*G01J 5/00* (2022.01)
(Continued)

(52) U.S. Cl.

CPC ............ *H10P 72/0602* (2026.01); *G01J 5/00* (2013.01); *H10P 50/242* (2026.01);
(Continued)

(58) Field of Classification Search

CPC ....... G01J 5/0007; G01J 5/00; H01L 21/2636; H01L 21/3065; H01L 21/67069;
(Continued)

(56) References Cited

U.S. PATENT DOCUMENTS 5,709,757 A * 1/1998 Hatano ............... C23C 16/4405 134/22.12
7,416,989 B1 8/2008 Liu et al.
(Continued)

FOREIGN PATENT DOCUMENTS

CN 101490810 B 4/2011
CN 105719949 A 6/2016
(Continued)

OTHER PUBLICATIONS

International Preliminary Report on Patentability dated Oct. 13, 2022, in PCT Application No. PCT/US2021/023701.
(Continued)

*Primary Examiner* — Sang Y Paik
(74) *Attorney, Agent, or Firm* — Weaver Austin Villeneuve & Sampson LLP

(57) ABSTRACT

Apparatuses and methods are described. An apparatus may include a processing chamber including chamber walls, a chamber heater configured to heat the walls, a pedestal positioned within the chamber and including a substrate heater having a plurality of light emitting diodes (LEDs) configured to emit light with wavelengths in the range of 400 nanometers (nm) and 800 nm, a window positioned above the heater and having a material transparent to light with wavelengths in the range of 400 nm and 800 nm, and three
(Continued)

or more substrate supports, each having a substrate support surface vertically offset from the window and configured to support a substrate such that the window and the substrate are offset by a nonzero distance.

22 Claims, 12 Drawing Sheets

(51) Int. Cl.
*H10P 50/24* (2026.01)
*H10P 72/76* (2026.01)
*H10P 95/90* (2026.01)

(52) U.S. Cl.
CPC ...... *H10P 72/0421* (2026.01); *H10P 72/0436* (2026.01); *H10P 72/7606* (2026.01); *H10P 72/7614* (2026.01); *H10P 95/90* (2026.01)

(58) Field of Classification Search
CPC ......... H01L 21/67103; H01L 21/67109; H01L 21/67115; H01L 21/67248; H01L 21/68721; H01L 21/6875; H10P 50/242; H10P 72/0421; H10P 72/0432; H10P 72/0434; H10P 72/0436; H10P 72/0602; H10P 72/7606; H10P 72/7614; H10P 95/90
USPC .......................................................... 392/411
See application file for complete search history.

(56) References Cited

U.S. PATENT DOCUMENTS

| | | | |
|---|---|---|---|
| 7,977,249 B1 | 7/2011 | Liu et al. | |
| 11,488,831 B2 | 11/2022 | Zhu et al. | |
| 12,568,781 B2 | 3/2026 | Musselwhite et al. | |
| 2003/0236642 A1* | 12/2003 | Timans | G01J 5/0821 702/99 |
| 2004/0026400 A1* | 2/2004 | Ptak | C23C 16/481 219/390 |
| 2005/0230350 A1 | 10/2005 | Kao et al. | |
| 2006/0084192 A1 | 4/2006 | Zhang | |
| 2006/0105516 A1 | 5/2006 | Belyansky et al. | |
| 2009/0142513 A1* | 6/2009 | Murakami | C23C 16/08 134/1.1 |
| 2010/0314377 A1* | 12/2010 | Kasai | H01L 21/67115 219/201 |
| 2011/0207302 A1 | 8/2011 | Wang et al. | |
| 2011/0266252 A1 | 11/2011 | Thadani et al. | |
| 2012/0083127 A1 | 4/2012 | Clark et al. | |
| 2012/0118225 A1* | 5/2012 | Hsu | C23C 16/52 118/667 |
| 2014/0263177 A1 | 9/2014 | Povolny et al. | |
| 2014/0376897 A1* | 12/2014 | Ranish | H01L 21/67115 392/416 |
| 2015/0093100 A1 | 4/2015 | Ranish | |
| 2015/0096683 A1 | 4/2015 | Deshmukh et al. | |
| 2015/0170977 A1 | 6/2015 | Singh | |
| 2015/0270148 A1 | 9/2015 | Shinoda et al. | |
| 2016/0231055 A1 | 8/2016 | Johnson et al. | |
| 2016/0307786 A1 | 10/2016 | Evans et al. | |
| 2017/0316963 A1 | 11/2017 | Parkhe | |
| 2017/0328775 A1 | 11/2017 | Aderhold | |
| 2018/0261481 A1 | 9/2018 | Eto | |
| 2018/0323092 A1 | 11/2018 | Rao et al. | |
| 2019/0051541 A1 | 2/2019 | Hill et al. | |
| 2019/0055654 A1 | 2/2019 | George et al. | |
| 2019/0086808 A1 | 3/2019 | Nakayama et al. | |
| 2019/0157168 A1* | 5/2019 | Kawarazaki | H01L 21/324 |
| 2019/0311923 A1 | 10/2019 | Kim | |
| 2019/0318946 A1 | 10/2019 | Kim | |
| 2019/0371631 A1 | 12/2019 | Lau et al. | |
| 2020/0294797 A1* | 9/2020 | Nozawa | H01L 21/67103 |
| 2021/0022212 A1 | 1/2021 | Cimino et al. | |
| 2021/0104413 A1 | 4/2021 | Gohira et al. | |
| 2021/0249274 A1 | 8/2021 | Zhu et al. | |
| 2021/0391166 A1 | 12/2021 | Zhu et al. | |
| 2022/0356585 A1 | 11/2022 | Mui et al. | |
| 2023/0268189 A1 | 8/2023 | Musselwhite et al. | |
| 2024/0355650 A1 | 10/2024 | Kanakasabapathy et al. | |
| 2025/0125165 A1 | 4/2025 | Kanakasabapathy et al. | |
| 2025/0216268 A1 | 7/2025 | Kalinovski et al. | |
| 2025/0218819 A1 | 7/2025 | Kalinovski et al. | |

FOREIGN PATENT DOCUMENTS

| | | |
|---|---|---|
| CN | 105990113 A | 10/2016 |
| CN | 107466423 A | 12/2017 |
| JP | H06291088 A | 10/1994 |
| JP | 2002521817 A | 7/2002 |
| JP | 2007531309 A | 11/2007 |
| JP | 2009042248 A | 2/2009 |
| JP | 2009253242 A | 10/2009 |
| JP | 2010034491 A | 2/2010 |
| JP | 2011035395 A | 2/2011 |
| JP | 2011165693 A | 8/2011 |
| JP | 2013030625 A | 2/2013 |
| JP | 2013522882 A | 6/2013 |
| JP | 2014075391 A | 4/2014 |
| JP | 2014197603 A | 10/2014 |
| JP | 2014225629 A | 12/2014 |
| JP | 2015056624 A | 3/2015 |
| JP | 2015185594 A | 10/2015 |
| JP | 2016076529 A | 5/2016 |
| JP | 2016096341 A | 5/2016 |
| JP | 2016170964 A | 9/2016 |
| JP | 2017084976 A | 5/2017 |
| JP | 2017183712 A | 10/2017 |
| JP | 2017224807 A | 12/2017 |
| JP | 2019114653 A | 7/2019 |
| JP | 2019521522 A | 7/2019 |
| JP | 2020522130 A | 7/2020 |
| JP | 2020188135 A | 11/2020 |
| JP | 2023551893 A | 12/2023 |
| KR | 20050014877 A | 2/2005 |
| KR | 100575847 B1 | 5/2006 |
| KR | 20060131795 A | 12/2006 |
| KR | 20120040124 A | 4/2012 |
| KR | 20140064227 A | 5/2014 |
| KR | 20170108871 A | 9/2017 |
| KR | 20180014436 A | 2/2018 |
| KR | 102078157 B1 | 2/2020 |
| KR | 20210034719 A | 3/2021 |
| TW | 201601217 A | 1/2016 |
| TW | 201739951 A | 11/2017 |
| TW | 201942997 A | 11/2019 |
| WO | WO-03080892 A1 | 10/2003 |
| WO | WO-2004001840 A1 | 12/2003 |
| WO | WO-2020132281 A1 | 6/2020 |
| WO | WO-2020264158 A1 | 12/2020 |
| WO | WO-2021054670 A1 | 3/2021 |
| WO | WO-2021202171 A1 | 10/2021 |

OTHER PUBLICATIONS

International Search Report and Written Opinion dated Jul. 15, 2021, in PCT Application No. PCT/US2021/023701.
International Preliminary Report on Patentability and Written Opinion dated Dec. 28, 2023 in PCT Application No. PCT/US2022/033488.
International Preliminary Report on Patentability and Written Opinion dated Feb. 29, 2024 in PCT Application No. PCT/US2022/075035.
International Preliminary Report on Patentability and Written Opinion dated Oct. 10, 2024 in PCT Application No. PCT/US2023/016762.
International Preliminary Report on Patentability dated Aug. 3, 2023, in Application No. PCT/US2022/013407.
International Search Report and Written Opinion dated Dec. 5, 2022 in PCT Application No. PCT/US2022/075035.

(56) References Cited

OTHER PUBLICATIONS

International Search Report and Written Opinion dated Jul. 24, 2023 in PCT Application No. PCT/US2023/016766.
International Search Report and Written Opinion dated Jul. 31, 2023, in Application No. PCT/US2023/016762.
International Search Report and Written Opinion dated May 9, 2022, in PCT Application No. PCT/US2022/013407.
International Search Report and Written Opinion dated Oct. 17, 2022 in PCT Application No. PCT/US2022/033488.
JP Office Action dated Nov. 26, 2024 in JP Application No. 2022-559850, with English Translation.
Kazunori, S. et al., "Isotropic Atomic Level Etching of Tungsten Using Formation and Desorption of Tungsten Fluoride," Proceedings of SPIE, Mar. 2018, vol. 10589, 7 pages.
KR Office Action dated Dec. 11, 2024 in KR Application No. 10-2022-7038172, with English Translation.
Mini O2 Oxygen Sensor 0-30% vol. 02, Euro-Gas Management Services LTD, Jan. 2017, https://euro-gasman.com/product/oxygen-o2-ss-gas-sensor/.
"Optical Properties of Silicon"[exact date of publication unknown; summarizing data from papers published in 1995 and 2008], https://www.pveducation.org/pvcdrom/materials/optical-properties-of-silicon.
Pattison, P.M., et al., "LED lighting Efficacy: Status and Directions," Comptes Rendus Physique, vol. 19, Apr. 2018, pp. 134-145.
TW Office Action dated Jul. 31, 2024 in TW Application No. 110111486, with English Translation.
U.S. Appl. No. 18/684,643, inventor Kanakasabapathy S, filed Feb. 16, 2024.
U.S. Appl. No. 18/848,895, inventors Kalinovski I, et al., filed Sep. 19, 2024.
JP Decision to Grant and Search Report dated Jun. 24, 2025 in JP Application No. 2022-559850, with English translation.
JP Office Action dated Aug. 26, 2025 in JP Application No. 2023-519875, with English Translation.
JP Office Action dated Mar. 11, 2025 in JP Application No. 2022-559850, with English Translation.
KR Decision for Grant and Search Report dated Aug. 7, 2025 in KR Application No. 10-2022-7038172, with English translation.
TW Office Action and Search Report dated Jun. 20, 2025 in TW Application No. 111102804, with English Translation.
TW Office Action and Search Report dated Sep. 15, 2025 in TW Application No. 114110878, with English Translation.
US Non-Final Office Action dated Jun. 3, 2025 in U.S. Appl. No. 18/004,051.
U.S. Notice of Allowance dated Oct. 28, 2025 in U.S. Appl. No. 18/004,051.
U.S. Restriction Requirement dated Feb. 13, 2025 in U.S. Appl. No. 18/004,051.
JP Office Action dated Apr. 14, 2026 in JP Application No. 2023-577298, with English Translation.
JP Office Action dated Jun. 2, 2026 in JP Application No. 2023-519875, with English translation.
KR Office Action dated Apr. 21, 2026 in KR Application No. 10-2024-7001033, with English Translation.
KR Office Action dated Feb. 9, 2026 in KR Application No. 10-2022-7044403, with English Translation.
TW Office Action and Search Report dated Mar. 6, 2026 in TW Application No. 111121950, with English Translation.
TW Office Action and Search Report dated May 13, 2026 in TW Application No. 111130897, with English Translation.
TW Office Action and Search Report dated May 21, 2026 in TW Application No. 111102804, with English Translation.
U.S. Appl. No. 19/462,970, inventors Musselwhite N et al., filed on Jan. 28, 2026.
TW Office Action and Search Report dated Jul. 30, 2026 in TW Application No. 112112210, with English Translation.
KR Office Action dated Jul. 30, 2026 in KR Application No. 10-2025-7036426, with English Translation.

* cited by examiner

RAPID AND PRECISE TEMPERATURE CONTROL FOR THERMAL ETCHING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor fabrication often involves patterning schemes and other processes whereby some materials are selectively etched to prevent etching of other exposed surfaces of a substrate. As device geometries become smaller and smaller, high etch selectivity processes are desirable to achieve effective etching of desired materials without plasma assistance.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some embodiments, an apparatus for semiconductor processing may be provided. The apparatus may include a processing chamber including chamber walls that at least partially bound a chamber interior, and a chamber heater configured to heat the chamber walls, a pedestal positioned within the chamber interior and including a substrate heater having a plurality of light emitting diodes (LEDs) configured to emit light with wavelengths in the range of 400 nanometers (nm) and 800 nm, a window positioned above the substrate heater, having a top surface and a bottom surface opposite the top surface that faces the LEDs, and including a material transparent to light with wavelengths in the range of 400 nm and 800 nm, and three or more substrate supports, each substrate having a substrate support surface vertically offset from the window and configured to support a substrate such that the window and the substrate supported by the three or more substrate supports are offset by a nonzero distance, and a gas distribution unit including one or more fluid inlets, a faceplate having a plurality of through-holes fluidically connected to the one or more fluid inlets and to the chamber interior, and having a front surface partially bounding the chamber interior, and a unit heater thermally connected to the faceplate such that heat can be transferred between the faceplate and the unit heater.

In some embodiments, each substrate support may include a material transparent to light with wavelengths in the range of 400 nm and 800 nm.

In some embodiments, the three or more substrate supports may each include quartz.

In some embodiments, the substrate support surfaces may be positioned closer to a center axis of the window than an outer diameter of the window top surface.

In some embodiments, each substrate support may include a temperature sensor configured to detect a temperature of a substrate positioned on the substrate support surface.

In some such embodiments, the temperature sensor may be a thermocouple.

In some embodiments, each substrate support surface may be vertically offset from the LEDs by a distance of between 1 millimeter and 100 millimeters.

In some embodiments, the window may include quartz.

In some such embodiments, the window may further include a sapphire coating.

In some embodiments, the window may not have hole in the center.

In some embodiments, the top surface of the window may be nonplanar.

In some embodiments, the bottom surface of the window may be nonplanar.

In some embodiments, the bottom surface of the window may be in contact with at least a first set of the LEDs.

In some embodiments, the pedestal may further include a sidewall, and an outer region of the window may be thermally connected to the sidewall such that heat can be transferred between the outer region and the sidewall.

In some embodiments, the substrate heater may further include a printed circuit board, by which the LEDs are supported, that includes a reflective material.

In some embodiments, the pedestal may include a bowl in which the substrate heater is positioned, and the bowl may include one or more sidewalls having an exterior surface that comprises reflective material.

In some embodiments, the pedestal may further include a pedestal cooler that is thermally connected to the LEDs such that heat can be transferred between the LEDs and the pedestal cooler, includes at least one fluid channel within the pedestal, and is configured to flow a cooling fluid within the at least one fluid channel.

In some such embodiments, the pedestal may further include a pedestal heater configured to heat one or more exterior surfaces of the pedestal.

In some further such embodiments, the pedestal heater may be a resistive heater.

In some embodiments, the pedestal may include a fluid inlet and is configured to flow a fluid between the LEDs and the bottom surface of the window.

In some embodiments, the pedestal may be configured to move vertically.

In some embodiments, the pedestal may be configured to move vertically to cause a vertical offset gap between the substrate support surfaces of the substrate support and the front surface of the faceplate of between about 2 millimeters (mm) and about 70 mm.

In some embodiments, a first set of LEDs may be arranged in a first circle having a first radius around a center axis of the substrate heater, and equally spaced apart from each other, and a second set of LEDs may be arranged in a second circle having a second radius larger than the first radius around the center axis, and equally spaced apart from each other.

In some embodiments, a first set of LEDs may be electrically connected to form a first electrical zone, a second set of LEDs may be electrically connected to form a second electrical zone, and the first and second electrical zones may be independently controllable.

In some embodiments, the plurality of LEDs may include more than about 1,000 LEDs, and the plurality of LEDs may be grouped to create at least about 80 independently controllable electrical zones.

In some such embodiments, the plurality of LEDs may include more than about 5,000 LEDs.

In some embodiments, each LED may be configured to emit visible blue light.

In some embodiments, each LED may be configured to emit visible white light.

In some embodiments, each LED may use about 1.5 watts or less at full power.

In some embodiments, each LED may use about 4 watts or less at full power.

In some embodiments, each LED may be a chip on board LED.

In some embodiments, each LED may be a surface mounted diode LED.

In some embodiments, the gas distribution unit may further include a second unit heater configured to heat the faceplate.

In some such embodiments, the second unit heater may be a resistive heater.

In some embodiments, the unit heater may include at least one fluid channel and may be configured to flow a heat transfer fluid within the at least one fluid channel.

In some embodiments, the apparatus may further include a mixing plenum fluidically connected to, and upstream of, at least one of the one or more fluid inlets of the gas distribution unit.

In some embodiments, the apparatus may further include one or more sensors configured to measure one or more metrics of the visible light emitted by the LEDs.

In some such embodiments, the one or more sensors may be photodetectors.

In some such embodiments, the one or more metrics may include the light emitted by the LEDs.

In some embodiments, the apparatus may further include a pyrometer having a detector and an emitter, in which the gas distribution unit may include a port that extends through the faceplate and that includes a sensor window, the emitter or the detector may be connected to the port and sensor window through a fiberoptic cable, and the emitter or the detector may be positioned in the pedestal and below the window.

In some such embodiments, the pyrometer may be configured to detect emissions having one or more wavelengths of about 1 micron, about 1.1 micron, or between about 1 and about 4 microns.

In some such embodiments, the pyrometer may be configured to detect emissions having wavelengths of about 1 micron, about 1.1 micron, and between about 1 and about 4 microns.

In some such embodiments, the sensor window may be located in a center region of the faceplate.

In some embodiments, the chamber walls may include aluminum.

In some embodiments, the chamber walls may include a plastic coating.

In some embodiments, the chamber walls may include a metal with a yttria coating.

In some embodiments, the chamber walls may include a metal with a zirconia coating.

In some embodiments, the chamber walls may include a metal or metal alloy with an aluminum oxide coating.

In some embodiments, the apparatus may further include a vacuum pump configured to evacuate the chamber interior, and processing chamber may be configured to operate in a pressure range of about 0.1 Torr to about 100 Torr.

In some embodiments, the apparatus may further include a controller having a processor and one or more non-transitory memory devices storing instructions for causing the LEDs to emit the visible light having wavelengths between 400 nm and 800 nm.

In some such embodiments, the apparatus may further include a cooling gas source fluidically connected to the one or more fluid inlets, in which the one or more non-transitory memory devices further store instructions for causing the cooling gas to flow onto the substrate.

In some further such embodiments, the pedestal may be configured to move vertically, and the one or more non-transitory memory devices may further store instructions for causing the pedestal to move vertically and cause the substrate to be offset from the faceplate by a non-zero gap less than or equal to about 5 mm, and the cooling gas may be flowed onto the substrate while the substrate is offset from the faceplate by the non-zero gap.

In some embodiments, a method may be provided. The method may include supporting a substrate in a processing chamber having chamber walls using only a pedestal having a plurality of substrate supports that each contact an edge region of the substrate, heating, while the substrate is supported by only the plurality of substrate supports, the substrate to a first temperature by emitting visible light from a plurality of light emitting diodes (LEDs) under the substrate, in which the visible light has wavelengths between 400 nanometers (nm) and 800 nm, and etching, while the substrate is supported by only the plurality of substrate supports and while the substrate is at the first temperature, a surface of the substrate.

In some embodiments, the method may further include cooling, while the substrate is supported by only the plurality of substrate supports, the substrate by one or more of flowing a cooling gas onto the substrate, and moving the pedestal vertically so that the substrate is offset from a faceplate of a gas distribution unit by a first nonzero offset distance, and thereby causing heat to transfer from the substrate to the faceplate through noncontact radiation.

In some such embodiments, the cooling may be by both flowing the cooling gas and positioning the substrate at the first nonzero offset distance from the faceplate.

In some further such embodiments, the first nonzero offset distance may be less than or equal to 5 mm.

In some such embodiments, the cooling gas may include one or more of hydrogen and helium.

In some embodiments, the method may further include heating, while the substrate is supported by only the plurality of substrate supports, the chamber walls to a second temperature, and heating, while the substrate is supported by only the plurality of substrate supports, a faceplate of a gas distribution unit positioned above the substrate to a third temperature, in which the etching is performed while the chamber walls are heated to the second temperature and the faceplate is heated to the third temperature.

In some such embodiments, the second temperature and the third temperature may be between 30° C. and 150° C.

In some embodiments, the supporting, heating, and etching may be performed while the processing chamber is at a pressure between about 0.1 Torr and about 100 Torr.

In some embodiments, the supporting, heating, and etching may be performed while the processing chamber is at a pressure between about 20 Torr and about 200 Torr.

In some embodiments, the first temperature may be between about 30° C. and about 200° C.

In some embodiments, the first temperature may be between about 100° C. and about 500° C.

In some embodiments, the method may further include measuring, using one or more temperature sensors, a temperature of the substrate, and adjusting, based on the measuring, a power of at least a first set of the plurality of LEDs during the heating, maintaining, and/or etching.

In some such embodiments, the one or more temperature sensors may include one or more of a temperature sensor in at least one of the substrate supports, and a pyrometer with an emitter configured to emit radiation onto the substrate and a detector configured to receive emissions from the substrate, a temperature of the substrate, in which the detector is configured to detect emissions having one or more wavelengths of about 1 micron, about 1.1 micron, or between about 1 and about 4 microns.

In some further such embodiments, the emitter may be configured to detect emissions having wavelengths of about 1 micron, about 1.1 micron, and between about 1 and about 4 microns.

In some further such embodiments, the one or more temperature sensors may include both the temperature sensor in at least one of the substrate supports and the pyrometer.

In some embodiments, the method may further include adjusting a power of at least a first set of the plurality of LEDs, heating, after the adjusting while the substrate is supported by only the plurality of substrate supports, the substrate to a second temperature by emitting visible light from the LEDs, and etching, while the substrate is supported by only the plurality of substrate supports and while the substrate is at the second temperature, a bottom surface of the substrate.

In some such embodiments, the method may further include measuring, using one or more temperature sensors, a temperature of the substrate, and the adjusting is performed based, at least in part, on the measuring.

In some further such embodiments, the one or more temperature sensors may include one or more of a temperature sensor in at least one of the substrate supports, and a pyrometer with an emitter configured to emit radiation onto the substrate and a receiver configured to receive emissions from the substrate, a temperature of the substrate, in which the detector is configured to detect emissions having one or more wavelengths of about 1 micron, about 1.1 micron, or between about 1 and about 4 microns.

In some further embodiments, the emitter may be configured to detect emissions having wavelengths of about 1 micron, about 1.1 micron, and between about 1 and about 4 microns.

In some further embodiments, the one or more temperature sensors may include both the temperature sensor in at least one of the substrate supports and the pyrometer.

In some embodiments, the supporting may further include supporting the substrate using only a plurality of substrate supports that include a material transparent to visible light having wavelengths between 400 nm and 800 nm.

In some embodiments, a method may be provided. The method may include emitting visible light from a plurality of light emitting diodes (LEDs) in a processing chamber, in which the visible light has wavelengths between 400 nanometers (nm) and 800 nm, measuring, using one or more sensors configured to detect the visible light emitted from the plurality of LEDs, one or more metrics of the visible light emitted by the LEDs, and adjusting, based at least in part on the measuring, a power of a first set of the plurality of LEDs, in which the first set includes less LEDs than the plurality of LEDs.

In some embodiments, the measuring may further include measuring the visible light using a photodetector.

In some such embodiments, the photodetector may be outside the processing chamber that and connected via fiberoptic cable to a port in the processing chamber.

In some embodiments, a pedestal for use in a semiconductor processing chamber may be provided. The pedestal may include a window having a top surface and a bottom surface opposite the top surface, and including a material transparent to visible light with wavelengths in the range of 400 nm and 800 nm, and three or more substrate supports, each substrate support including a material transparent to visible light with wavelengths in the range of 400 nm and 800 nm, having a substrate support surface configured to support a substrate such that the window and the substrate supported by the three or more substrate are offset by a nonzero distance, and having a temperature sensor configured to detect a temperature of a substrate positioned on the substrate support surface.

In some embodiments, the three or more substrate supports may each include quartz.

In some embodiments, the substrate support surfaces may be positioned closer to a center axis of the window than an outer diameter of the window top surface.

In some embodiments, each temperature sensor may be a thermocouple.

In some embodiments, each substrate support surface may be vertically offset from the window by a distance between about 5 and about 30 millimeters.

In some embodiments, the pedestal may further include a substrate heater having a plurality of light emitting diodes (LEDs) configured to emit vising light with wavelengths in the range of 400 nm and 800 nm.

In some embodiments, a pedestal for use in a semiconductor processing chamber may be provided. The pedestal may include a substrate heater having a plurality of light emitting diodes (LEDs) configured to emit vising light with wavelengths in the range of 400 nanometers (nm) and 800 nm, and a window having a top surface and a bottom surface opposite the top surface, and comprising a material transparent to visible light with wavelengths in the range of 400 nm and 800 nm, in which one or more of the top surface and the bottom surface are nonplanar surfaces.

In some embodiments, both the top surface and the bottom surface may be nonplanar surfaces.

In some embodiments, the bottom surface of the window may be in contact with at least a first set of the LEDs.

In some embodiments, the pedestal may further include a sidewall, and an outer region of the window may be thermally connected to the sidewall such that heat can be transferred between the outer region and the sidewall.

In some embodiments, the substrate heater may further includes a printed circuit board, by which the LEDs are supported, that includes a reflective material.

In some embodiments, the pedestal may include a bowl in which the substrate heater is positioned, the bowl may include one or more sidewalls having an exterior surface that comprises reflective material.

In some embodiments, the pedestal may further include a pedestal cooler that is thermally connected to the LEDs such that heat can be transferred between the LEDs and the pedestal cooler, includes at least one fluid channel within the pedestal, and is configured to flow a cooling fluid within the at least one fluid channel.

In some such embodiments, the pedestal may further include a pedestal heater configured to heat one or more exterior surfaces of the pedestal.

In some further such embodiments, the pedestal heater may be a resistive heater.

In some embodiments, the pedestal may include a fluid inlet and may be configured to flow a fluid between the LEDs and the bottom surface of the window.

In some embodiments, a first set of LEDs may be arranged in a first circle having a first radius around a center axis of the substrate heater, and equally spaced apart from each other, and a second set of LEDs may be arranged in a second circle having a second radius larger than the first radius around the center axis, and equally spaced apart from each other.

In some embodiments, a first set of LEDs may be electrically connected to form a first electrical zone, a second set of LEDs may be electrically connected to form a second electrical zone, and the first and second electrical zones may be independently controllable.

In some embodiments, the plurality of LEDs may include more than 1,000 LEDs, and the plurality of LEDs may be grouped to create at least about 80 independently controllable electrical zones.

In some such embodiments, the plurality of LEDs may include more than about 5,000 LEDs.

In some embodiments, each LED may be configured to emit visible blue light.

In some embodiments, each LED may be configured to emit visible white light.

In some embodiments, each LED may use about 1.5 watts or less at full power.

In some embodiments, each LED may use about 4 watts or less at full power.

In some embodiments, each LED may be a chip on board LED.

In some embodiments, each LED may be a surface mounted diode LED.

In some embodiments, an apparatus may be provided. The apparatus may include a processing chamber including chamber walls that at least partially bound a chamber interior, a pedestal positioned within the chamber interior and configured to support a substrate, and a pyrometer having a detector and an emitter, in which the processing chamber includes a port that extends through a surface of the processing chamber that is above the pedestal, and that includes a sensor window, the emitter or the detector is connected to the port and sensor window through a fiberoptic cable, the emitter or the detector is positioned in the pedestal, and the pyrometer is configured to detect emissions having one or more wavelengths of about 1 micron, about 1.1 micron, or between about 1 and about 4 microns.

In some embodiments, the pyrometer may be configured to detect emissions having wavelengths of about 1 micron, about 1.1 micron, and between about 1 and about 4 microns.

In some embodiments, the sensor window may be located in a center region of processing chamber.

In some embodiments, the processing chamber may be further include a gas distribution unit including one or more fluid inlets and a faceplate having a plurality of through-holes fluidically connected to the one or more fluid inlets and to a chamber interior, and having a front surface partially bounding the chamber interior, and the port may extend through the front surface of the faceplate.

In some embodiments, the apparatus may further include one or more sensors configured to measure one or more metrics of the visible light emitted by the LEDs.

In some such embodiments, the one or more sensors may be photodetectors.

In some such embodiments, the one or more metrics may include light emitted by the LEDs.

In some embodiments, a method may be provided. The method may include supporting a substrate in a processing chamber having chamber walls using only a pedestal having a plurality of substrate supports that each contact an edge region of the substrate, heating, while the substrate is supported by only the plurality of substrate supports, the substrate to a first temperature by emitting visible light from a plurality of light emitting diodes (LEDs) under the substrate, in which the visible light has wavelengths between 400 nanometers (nm) and 800 nm, and cooling, while the substrate is supported by only the plurality of substrate supports, the substrate by one or more of flowing a cooling gas onto the substrate, and moving the pedestal vertically so that the substrate is offset from a faceplate of a gas distribution unit by a first nonzero offset distance less than or equal to 5 mm, and thereby causing heat to transfer from the substrate to the faceplate through noncontact radiation.

In some embodiments, the cooling may be by flowing the cooling gas onto the substrate.

In some embodiments, the cooling may be by positioning the substrate at the first nonzero offset distance from the faceplate.

In some embodiments, the cooling may be by both flowing the cooling gas and positioning the substrate at the first nonzero offset distance from the faceplate.

In some such embodiments, the cooling gas may include one of or more of hydrogen and helium.

DETAILED DESCRIPTION

Figure 1:
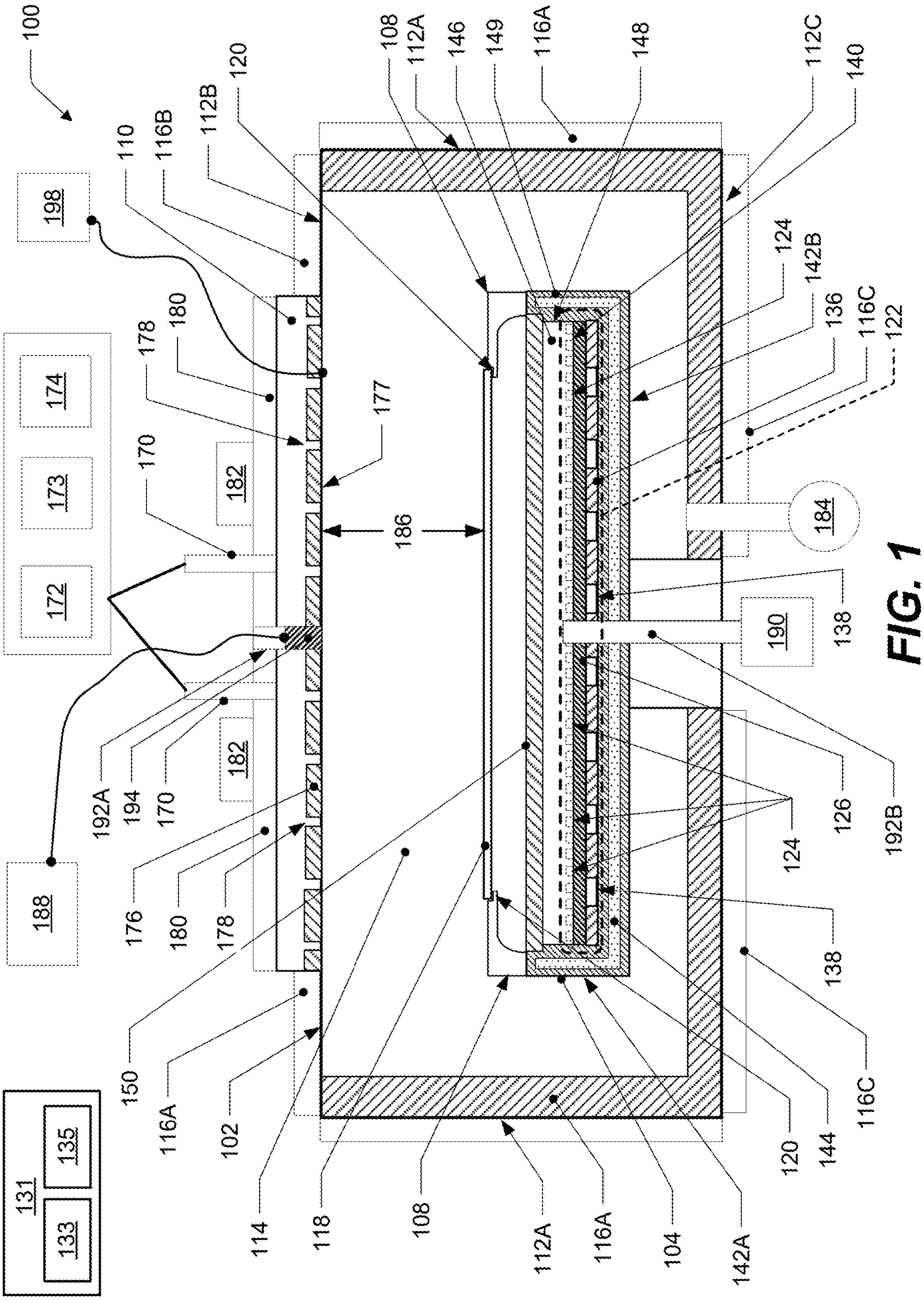
FIG. 1 depicts a cross-sectional side view of an example apparatus in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Introduction and Context

Semiconductor fabrication processes often involve patterning and etching of various materials, including conductors, semiconductors, and dielectrics. Some examples include conductors, such as metals or carbon; semiconductors, such as silicon or germanium; and dielectrics, such as silicon oxide, aluminum dioxide, zirconium dioxide, hafnium dioxide, silicon nitride, and titanium nitride. Atomic layer etching ("ALE") processes provide one class of etching techniques that involve repeated variations in etch conditions over the course of an etch operation. ALE processes remove thin layers of material using sequential self-limiting reactions. Generally, an ALE cycle is the minimum set of operations used to perform an etch process one time, such as etching a monolayer. The result of one ALE cycle is that at least some of a film layer on a substrate surface is etched. Typically, an ALE cycle includes a modification operation to form a reactive layer, followed by a removal operation to remove or etch only this reactive layer. The cycle may include certain ancillary operations such as removing one of the reactants or byproducts. Generally, a cycle contains one instance of a unique sequence of operations.

As an example, a conventional ALE cycle may include the following operations: (i) delivery of a reactant gas to perform a modification operation, (ii) purging of the reactant gas from the chamber, (iii) delivery of a removal gas and an optional plasma to perform a removal operation, and (iv) purging of the chamber. In some embodiments, etching may be performed nonconformally. The modification operation generally forms a thin, reactive surface layer with a thickness less than the un-modified material. In an example modification operation, a substrate may be chlorinated by introducing chlorine into the chamber. Chlorine is used as an example etchant species or etching gas, but it will be understood that a different etching gas may be introduced into the chamber. The etching gas may be selected depending on the type and chemistry of the substrate to be etched. A plasma may be ignited and chlorine reacts with the substrate for the etching process; the chlorine may react with the substrate or may be adsorbed onto the surface of the substrate. The species generated from a chlorine plasma can be generated directly by forming a plasma in the process chamber housing the substrate or they can be generated remotely in a process chamber that does not house the substrate, and can be supplied into the process chamber housing the substrate.

In some instances, a purge may be performed after a modification operation. In a purge operation, non-surface-bound active chlorine species may be removed from the process chamber. This can be done by purging and/or evacuating the process chamber to remove the active species, without removing the adsorbed layer. The species generated in a chlorine plasma can be removed by simply stopping the plasma and allowing the remaining species decay, optionally combined with purging and/or evacuation of the chamber. Purging can be done using any inert gas such as N2, Ar, Ne, He and their combinations.

In a removal operation, the substrate may be exposed to an energy source to etch the substrate by directional sputtering (this may include activating or sputtering gas or chemically reactive species that induce removal). In some embodiments, the removal operation may be performed by ion bombardment using argon or helium ions. During removal, a bias may be optionally turned on to facilitate directional sputtering. In some embodiments, ALE may be isotropic; in some other embodiments ALE is not isotropic when ions are used in the removal process.

In various examples, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate. In some embodiments, each ALE cycle may etch at least about 0.1 Å, 0.5 Å, or 1 Å.

In some instances, prior to etching, the substrate may include a blanket layer of material, such as silicon or germanium. The substrate may include a patterned mask layer previously deposited and patterned on the substrate. For example, a mask layer may be deposited and patterned on a substrate including a blanket amorphous silicon layer. The layers on the substrate may also be patterned. Substrates may have "features" such as fins, or holes, which may be characterized by one or more of narrow and/or re-entrant openings, constrictions within the feature, and high aspect ratios. One example of a feature is a hole or via in a semiconductor substrate or a layer on the substrate. Another example is a trench in a substrate or layer. In various instances, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

The use of plasma during conventional etching presents numerous challenges and disadvantages. For instance, it is generally desirable to create the same plasma conditions for each ALE cycle of a single substrate as well as for all substrates in a batch, but it can be difficult to repeatedly recreate the same plasma conditions due to some plasmas changing due to accumulation of material in the process chamber. Additionally, many conventional ALE processes may cause damage to exposed components of the substrate, such as silicon oxide, may cause defects, and may increase the top-to-bottom ratio of a pattern and increase the pattern loading. Defects may lead to pattern-missing to the extent that the device may be rendered useless. Plasma-assisted ALE also utilizes small radicals, i.e., deeply dissociated radicals, that are more aggressive which causes them to remove more material than may be desired, thereby reducing the selectivity of this etching. As a result, conventional ALE techniques are often unsuitable for selectively etching some materials, such as aluminum dioxide, zirconium dioxide, hafnium dioxide, silicon nitride, and titanium nitride. It is therefore desirable to determine new etching techniques and apparatuses that do not use a plasma and that are able to provide rapid and precise temperature control of a substrate during processing.

More generally, apparatus designed or configured to provide variable reaction conditions over the course of an etch process, regardless of whether that process is an ALE process or some other etch process that employs varying conditions. In certain embodiments, the apparatus is designed or configured to provide rapidly varying temperature over the course of an etch process.

Apparatuses for Thermal Processing

Provided herein are methods and apparatuses for rapidly and precisely controlling a substrate's temperature during semiconductor processing, including performing etching using thermal energy, rather than or in addition to plasma energy, to drive the modification and removal operations. In certain embodiments, etching that relies upon chemical reactions in conjunction with primarily thermal energy, not a plasma, to drive the chemical reactions in the modification and removal operations may be considered "thermal etching". This etching is not limited to ALE; it is applicable to any etching technique.

In certain embodiments, thermal etching processes, such as those employing one or more thermal cycles have relatively fast heating and cooling and relatively precise temperature control. In some cases, these features may be leveraged to provide good throughput and/or to reduce nonuniformity and wafer defects.

However, many conventional etching apparatuses do not have the ability to adjust and control the temperature of the substrate with adequate speed. For example, while some etching apparatuses may be able to heat a substrate to multiple temperatures, they can do so only slowly, or they may not be able to reach the desired temperature ranges, or they may not be able to maintain the substrate temperature for the desired time and at the desired temperature ranges. Similarly, typical etching apparatuses are often unable to cool the substrate fast enough to enable high throughput or cool the substrate to the desired temperature ranges. For some applications, it is desirable to reduce the temperature ramp times as much as possible, such as to less than about 120 seconds in some embodiments, but many conventional etching apparatuses cannot heat, cool, or both, a substrate less than that time; it may take some apparatuses multiple minutes to cool and/or heat a substrate which slows throughput.

In various embodiments, apparatuses described herein are designed or configured to rapidly heat and cool a wafer, and precisely control a wafer's temperature. In some embodiments, the wafer is rapidly heated and its temperature is precisely controlled using, in part, visible light emitted from light emitting diodes (LEDs) positioned in a pedestal under the wafer. The visible light may have wavelengths that include and range between 400 nanometers (nm) and 800 nm. The pedestal may include various features for enabling wafer temperature control, such as a transparent window that may have lensing for advantageously directing or focusing the emitted light, reflective material also for advantageously directing or focusing the emitted light, and temperature control elements that assist with temperature control of the LEDs, the pedestal, and the chamber.

The apparatuses may also thermally isolate, or thermally "float," the wafer within the processing chamber so that only the smallest thermal mass is heated, the ideal smallest thermal mass being just the substrate itself, which enables faster heating and cooling. The wafer may be rapidly cooled using a cooling gas and radiative heat transfer to a heat sink, such as a top plate (or other gas distribution element) above the wafer, or both. In some instances, the apparatus also includes temperature control elements within the processing chamber walls, pedestal, and top plate (or other gas distribution element), to enable further temperature control of the wafer and processing conditions within the chamber, such the prevention of unwanted condensation of processing gases and vapors.

The apparatuses may also be configured to implement various control loops to precisely control the wafer and the chamber temperatures (e.g., with a controller configured to execute instructions that cause the apparatus to perform these loops). This may include the use of various sensors that determine wafer and chamber temperatures as part of open loops and feedback control loops. These sensors may include temperature sensors in the wafer supports which contact the wafer and measure its temperature, and non-contact sensors such as photodetectors to measure light output of the LEDs and a pyrometer configured to measure the temperature of different types of wafers. As described in more detail below, some pyrometers determine an item's temperature by emitting infrared or other optical signals at the item and measuring the signals reflected or emitted by the item. However, many silicon wafers cannot be measured by some pyrometers because the silicon can be optically transparent at various temperatures and with various treatments, e.g., doped or low doped silicon. For example, a low doped silicon wafer at a temperature less than 200° C. is transparent to infrared signals. The novel pyrometers provided herein are able to measure multiple types of silicon wafers at various temperatures.

FIG. 1 depicts a cross-sectional side view of an example apparatus in accordance with disclosed embodiments. As detailed below, this apparatus 100 is capable of rapidly and precisely controlling the temperature of a substrate, including performing thermal etching operations. The apparatus 100 includes a processing chamber 102, a pedestal 104 having a substrate heater 106 and a plurality of substrates supports 108 configured to support a substrate 118, and a gas distribution unit 110.

The processing chamber 102 includes sides walls 112A, a top 112B, and a bottom 112C, that at least partially define the chamber interior 114, which may be considered a plenum volume. As stated herein, it may be desirable in some embodiments to actively control the temperature of the processing chamber walls 112A, top 112B, and bottom 112C in order to prevent unwanted condensation on their surfaces. Some emerging semiconductor processing operations flow vapors, such as water and/or alcohol vapor, onto the substrate which adsorb onto the substrate, but they may also undesirably adsorb onto the chamber's interior surfaces. This can lead to unwanted deposition and etching on the chamber interior surfaces which can damage the chamber surfaces and cause particulates to flake off onto the substrate thereby causing substrate defects. In order to reduce and prevent unwanted condensation on the chamber's interior surfaces, the temperature of chamber's walls, top, and bottom may be maintained at a temperature at which condensation of chemistries used in the processing operations does not occur.

This active temperature control of the chamber's surfaces may be achieved by using heaters to heat the chamber walls 112A, the top 112B, and the bottom 112C. As illustrated in FIG. 1, chamber heaters 116A are positioned on and configured to heat the chamber walls 112A, chamber heaters 116B are positioned on and configured to heat the top 112B, and chamber heaters 116C are positioned on and configured to heat the bottom 112C. The chamber heaters 116A-116C may be resistive heaters that are configured to generate heat when an electrical current is flowed through a resistive element. Chamber heaters 116A-116C may also be fluid conduits through which a heat transfer fluid may be flowed, such as a heating fluid which may include heated water. In some instances, the chamber heaters 116A-116C may be a combination of both heating fluid and resistive heaters. The chamber heaters 116A-116C are configured to generate heat in order to cause the interior surfaces of each of the chamber walls 112A, the top 112B, and the bottom 112C to the desired temperature, which may range between about 40° C. and about 150° C., including between about 80° C. and about 130° C., about 90° C. or about 120° C., for instance. It has been discovered that under some conditions, water and alcohol vapors do not condense on surfaces kept at about 90° C. or higher.

The chamber walls 112A, top 112B, and bottom 112C, may also be comprised of various materials that can withstand the chemistries used in the processing techniques. These chamber materials may include, for example, an aluminum, anodized aluminum, aluminum with a polymer, such as a plastic, a metal or metal alloy with a yttria coating, a metal or metal alloy with a zirconia coating, and a metal or metal alloy with aluminum oxide coating; in some instances the materials of the coatings may be blended or layers of differing material combinations, such as alternating layers of aluminum oxide and yttria, or aluminum oxide and zirconia. These materials are configured to withstand the chemistries used in the processing techniques, such as anyhydrous HF, water vapor, methanol, isopropyl alcohol, chlorine, fluorine gases, nitrogen gas, hydrogen gas, helium gas, and the mixtures thereof.

The apparatus 100 may also be configured to perform processing operations at or near a vacuum, such as at a pressure of about 0.1 Torr to about 100 Torr, or about 20 Torr to about 200 Torr, or about 0.1 Torr to about 10 Torr. This may include a vacuum pump 184 configured to pump the chamber interior 114 to low pressures, such as a vacuum having a pressure of about 0.1 Torr to about 100 Torr, including about 0.1 Torr to about 10 Torr, and about 20 Torr to about 200 Torr, or about 0.1 Torr to about 10 Torr.

Various features of the pedestal 104 will now be discussed. The pedestal 104 includes a heater 122 (encompassed by the dashed rectangle in FIG. 1) that has a plurality of LEDs 124 that are configured to emit visible light having wavelengths including and between 400 nm to 800 nm, including 450 nm. The heater LEDs emit this visible light onto the backside of the substrate which heats the substrate. Visible light having wavelengths from about 400 nm to 800 nm is able to quickly and efficiently heat silicon wafers from ambient temperature, e.g., about 20° C., to about 600° C. because silicon absorbs light within this range. In contrast, radiant, including infrared radiant, heating may ineffectively heat silicon at temperatures up to about 400° C. because silicon tends to be transparent to infrared at temperatures lower than about 400° C. Additionally, radiant heaters that directly heat the topside of a wafer, as in many conventional semiconductor processes, can cause damage or other adverse effects to the topside films. Many "hot plate" heaters that rely on solid-to-solid thermal transference between the substrate and a heating platen, such as a pedestal with a heating coil, have relatively slow to heating and cooling rates, and provide non-uniform heating which may be caused by substrate warping and inconsistent contact with the heating platen. For example, it may take multiple minutes to heat some pedestals to a desired temperature, and from a first to a second higher temperature, as well as to cool the pedestal to a lower temperature.

Figure 13:
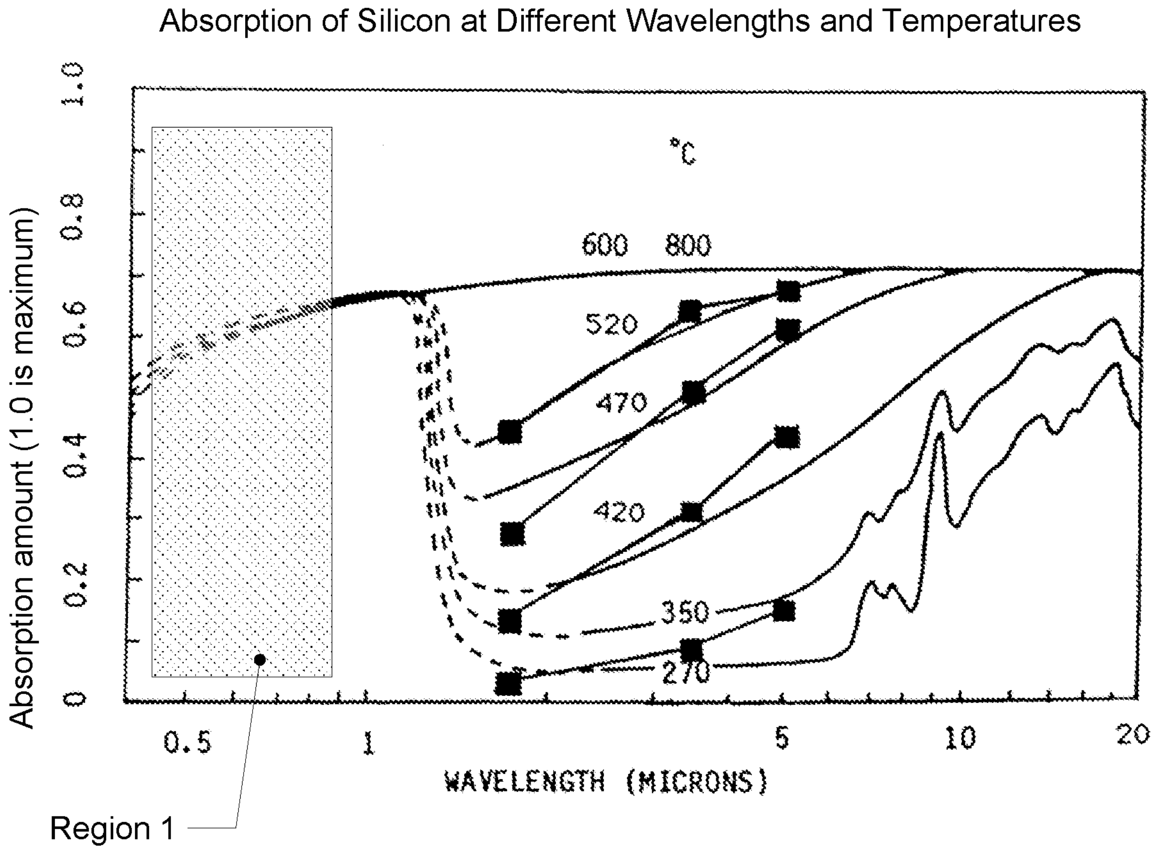
FIG. 13 depicts a graph of silicon absorption at various wavelengths and temperatures.

FIG. 13 depicts a graph of silicon absorption at various wavelengths and temperatures. The x-axis is light wavelengths, the vertical axis is absorption with 1.0 being the maximum (i.e., 100%); the data is light absorption of silicon at different temperatures. As can be seen, in Region 1, silicon's absorption of light between 400 nm to 800 nm remains relatively constant with changes in the silicon's temperature. However, as the silicon's absorption of infrared light, i.e., light with wavelengths above about 1 micron, changes with the temperature the silicon such that the silicon absorption is inconsistent until the temperature reaches 600° C. Additionally, the absorption range for various wavelengths and temperatures is reduced as compared to the visible range. For example, silicon at 270° C. has a very low absorption rate, about 0.05 or 5%, for infrared emissions from about 1.8 microns to about 6 microns, and then inconsistent rates from about 6 microns to 10 microns. Silicon at 350° C. has the next lowest absorption rate of infrared light, ranging between about 10% and 20% from about 1.8 microns to about 5 microns. Accordingly, using visible light results in consistent absorption independent of the silicon's temperature.

The heater's plurality of LEDs may be arranged, electrically connected, and electrically controlled in various manners. Each LED may be configured to emit a visible blue light and/or a visible white light. In certain embodiments, white light (produced using a range of wavelengths in the visible portion of the EM spectrum) is used. In some semiconductor processing operations, white light can reduce or prevent unwanted thin film interference. For instance, some substrates have backside films that reflect different light wavelengths in various amounts, thereby creating an uneven and potentially inefficient heating. Using white light can reduce this unwanted reflection variation by averaging out the thin film interference over the broad visible spectrum provided by white light. In some instances, depending on the material on the back face of the substrate, it may be advantageous to use a visible non-white light, such as a blue light having a 450 nm wavelength, for example, in order to provide a single or narrow band of wavelength which may provide more efficient, powerful, and direct heating of some substrates that may absorb the narrow band wavelength better than white light.

Various types of LED may be employed. Examples include a chip on board (COB) LED or a surface mounted diode (SMD) LED. For SMD LEDs, the LED chip may be fused to a printed circuit board (PCB) that may have multiple electrical contacts allowing for the control of each diode on the chip. For example, a single SMD chip may have three diodes (e.g., red, blue, or green) that can be individually controllable to create different colors, for instance. SMD LED chips may range in size, such as 2.8×2.5 mm, 3.0×3.0 mm, 3.5×2.8 mm, 5.0×5.0 mm, and 5.6×3.0 mm. For COB LEDs, each chip can have more than three diodes, such as nine, 12, tens, hundreds or more, printed on the same PCB. COB LED chips typically have one circuit and two contacts regardless of the number of diodes, thereby providing a simple design and efficient single color application. The ability and performance of LEDs to heat the substrate may be measured by the watts of heat emitted by each LED; these watts of heat may directly contribute to heating the substrate.

Figure 2:
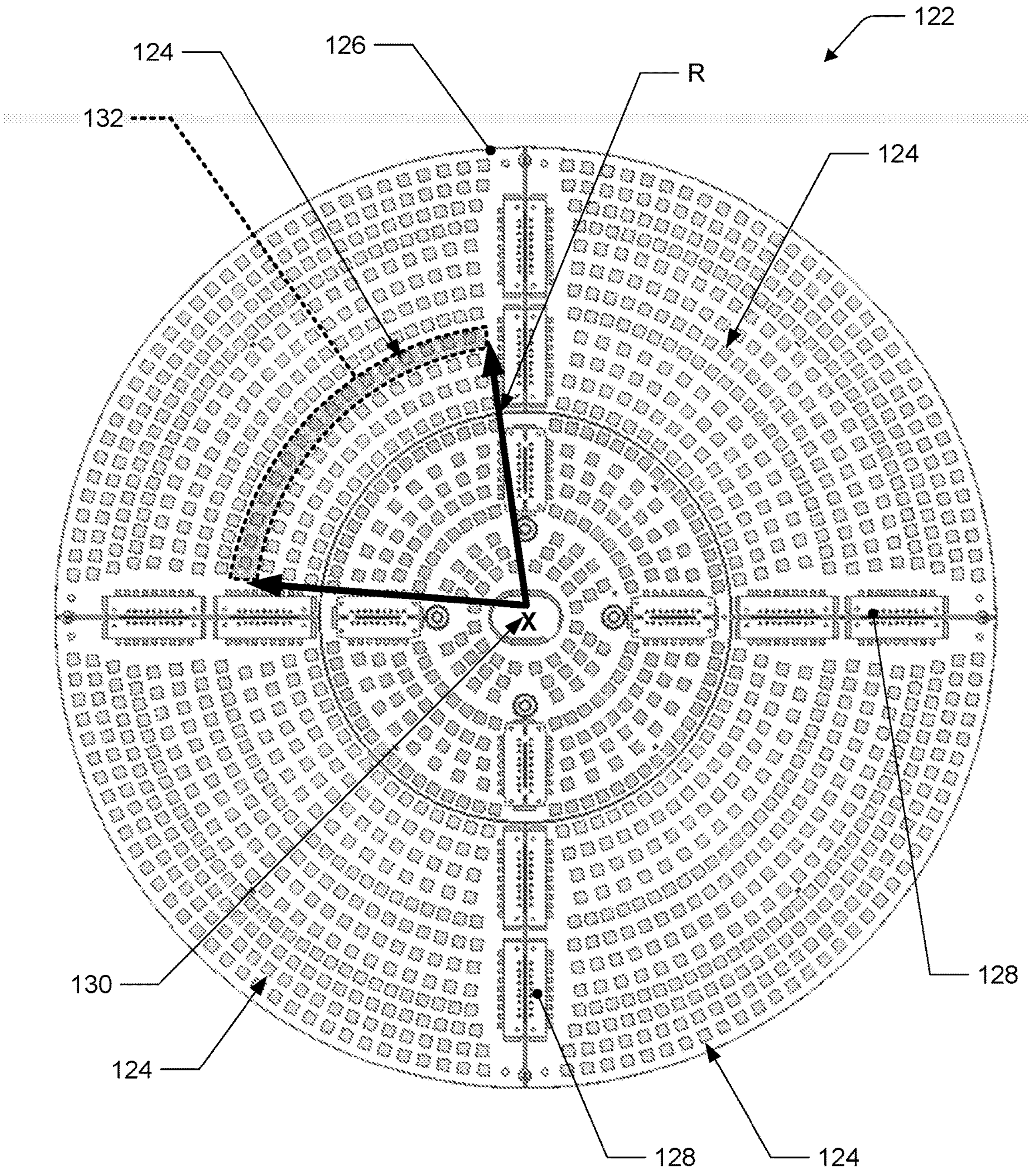
FIG. 2 depicts a top view of a substrate heater with a plurality LEDs.

FIG. 2 depicts a top view of a substrate heater with a plurality LEDs. This substrate heater 122 includes a printed circuit board 126 and the plurality of LEDs 124, some of which are labeled; this depicted plurality includes approximately 1,300 LEDs. External connections 128 are connected by traces to provide power to the plurality of LEDs 124. As illustrated in FIG. 2, the LEDs may be arranged along numerous arcs that are radially offset from the center 130 of the substrate heater 122 by different radiuses; in each arc, the LEDs may be equally spaced from each other. For example, one arc 132 is surrounded by a partially shaded dotted shape, includes 16 LEDs 124, and is a part of a circle with a radius R that extends around the center 130. The 16 LEDs 124 may be considered equally spaced from each other along this arc 132.

Figure 3:
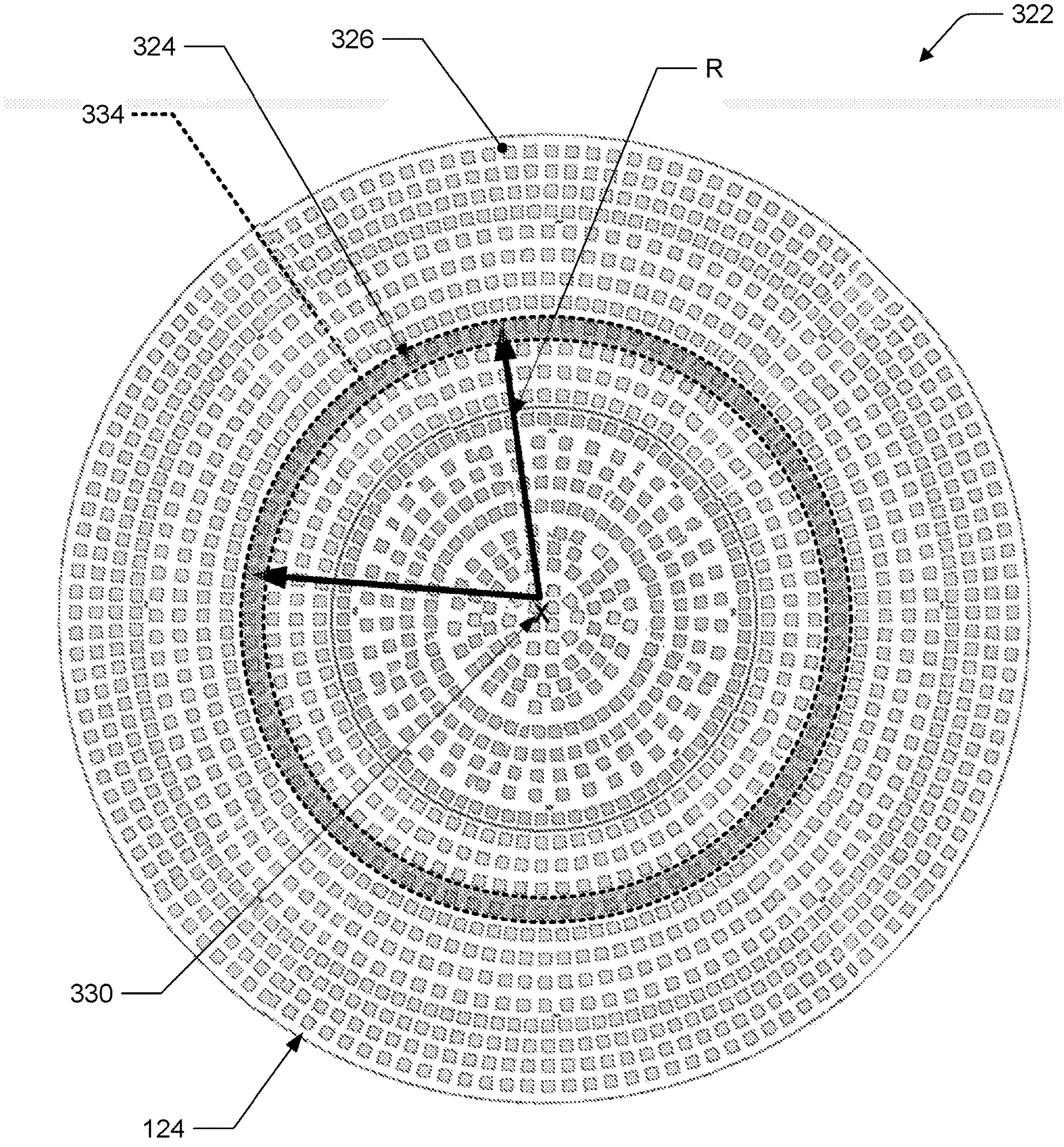
FIG. 3 depicts a top view of another substrate heater with a plurality LEDs.

In some embodiments, the LEDs may also be arranged along circles around the center of the substrate heater. In some instances, some LEDs may be arranged along circles while others may be arranged along arcs. FIG. 3 depicts a top view of another example of a substrate heater with a plurality LEDs. This substrate heater 322 includes a printed circuit board 326 and the plurality of LEDs 324, some of which are labeled. Here, LEDs 324 are arranged along numerous circles that are radially offset from the center 330 of the substrate heater 322 by different radiuses; in each circle, the LEDs may be equally spaced from each other. For example, one circle 334 is surrounded by a partially shaded ring, includes 78 LEDs 324, a radius R that extends around the center 330. The 78 LEDs 324 may be considered equally spaced from each other along this circle 334. The arrangement of the LEDs in FIG. 3 may provide a more uniform light and heat distribution pattern across the entire backside of the substrate because the regions of the substrate heater 122 in FIG. 2 that contain the external connections may provide unheated cold spots on the wafer, especially because the substrate and heater remain stationary with respect to each other during processing; the substrate and the substrate heater do not rotate.

In some embodiments, the plurality of LEDs may include at least about 1,000 LEDs, including about 1,200, 1,500, 2,000, 3,000, 4,000, 5,000, or more than 6,000, for instance. Each LED may, in some instances, be configured to uses 4 watts or less at 100% power, including 3 watts at 100% power and 1 watt at 100% power. These LEDs may be arranged and electrically connected into individually controllable zones to enable temperature adjustment and fine tuning across the substrate. In some instances, the LEDs may be grouped into at least 20, for instance, independently controllable zones, including at least about 25, 50, 75, 80, 85 90, 95, or 100 zones, for instance. These zones may allow for temperature adjustments in the radial and azimuthal (i.e., angular) directions. These zones can be arranged in a defined pattern, such as a rectangular grid, a hexagonal grid, or other suitable pattern for generating a temperature profile as desired. The zones may also have varying shapes, such as square, trapezoidal, rectangular, triangular, obround, elliptical, circular, annular (e.g., a ring), partially annular (i.e., an annular sector), an arc, a segment, and a sector that may be centered on the center of the heater and have a radius less than or equal to the overall radius of the substrate heater's PCB. For example, in FIG. 2 the LEDs have 88 zones that are organized into at least 20, such as 20 or 21, concentric rings. These zones are able to adjust the temperature at numerous locations across the wafer in order to create a more even temperature distribution as well as desired temperature profiles, such as higher temperatures around the edge of the substrate than in the center of the substrate. The independent control of these zones may also include the ability to control the power output of each zone. For example, each zone may have at least 15, 20, or 25 adjustable power outputs. In some instances, each zone may have one LED thereby enabling each LED to be individually controlled and adjusted which can lead to a more uniform heating profile on the substrate. Accordingly, in some embodiments, each LED of the plurality of LEDs in the substrate heater may be individually controllable.

In certain embodiments, the substrate heater 122 is configured to heat the substrate to multiple temperatures and maintain each such temperatures for various durations. These durations may include the following non-limiting examples of at least about 1 second, at least about 5 seconds, at least about 10 seconds, at least about 30 seconds, at least about 60 seconds, at least about 90 seconds, at least about 120 second, at least about 150 seconds, or at least about 180 seconds. The substrate heater may be configured to heat the substrate to between about 50° C. and 600° C., including between about 50° C. and 150° C., including about 130° C., or between about 150° C. and 350° C., for example. The substrate heater may be configured to maintain the substrate at a temperature within these ranges for various durations, including the following non-limiting examples: at least about 1 second, at least about 5 seconds, at least about 10 seconds, at least about 30 seconds, at least about 60 seconds, at least about 90 seconds, at least about 120 seconds, at least about 150 seconds, or at least about 180 seconds, for example. Additionally, in some embodiments, the substrate heater 122 is configured to heat the substrate to any temperature within these ranges in less than about 60 seconds, less than about 45 seconds, less than about 30 seconds, or less than about 15 seconds, for instance. In certain embodiments, the substrate heater 122 is configured to heat a substrate at one or more heating rates, such as between at least about 0.1° C./second and at least about 20° C./second, for example.

The substrate heater may increase the temperature of the substrate by causing the LEDs to emit the visible light at one or more power levels, including at least about 80%, at least about 90%, at least about 95%, or at least about 100% power. In some embodiments, the substrate heater is configured to emit light between about 10 W and 4000 W, including at least about 10 W, at least about 30 W, at least about 0.3 kilowatt (KW), at least about 0.5 kW, at least about 2 kW, at least about 3 kW, or at least about 4 kw. The apparatus is configured to supply between about 0.1 kw and 9 kW of power to the pedestal; the power supply is connected to the substrate heater through the pedestal but is not depicted in the Figures. During temperature ramps, the substrate heater may operate at the high powers, and may operate at the lower power levels (e.g., include between about 5 W and about 0.5 kW) to maintain the temperature of a heated substrate.

The pedestal may include reflective material on its internal surfaces that, during operation, reflects and directs the light emitted by the LEDs onto the backside of the substrate supported by the pedestal. In some such embodiments, the substrate heater may include such reflective material positioned on a top surface 140, as shown in FIG. 1, of the PCB 126 on which the plurality of LEDs 124 is positioned. The reflective material may be comprised of aluminum, such as polished aluminum, stainless steel, aluminum alloys, nickel alloys, and other protective layers which can prevent oxidation of the metal and/or enhance the reflectivity at specific wavelengths, such as reaching greater than 99% reflectivity for specific wavelengths, and other durable reflective coatings. Additionally or alternatively, the pedestal 104 may have a bowl 146 in which the substrate heater 122 is at least partially positioned. The bowl 146 may have exposed internal surfaces 148 of the pedestal sidewalls 149 upon which the reflective material may be positioned. This reflective material increases the heating efficiency of the substrate heater and reduces the unwanted heating of the PCB 126 and pedestal 104 by advantageously directing light back onto the substrate that would have otherwise been absorbed by the PCB 126 and the pedestal 104.

In some embodiments, the substrate heater may also include a pedestal cooler that is thermally connected to the LEDs such that heat generated by the plurality of LEDs can be transferred from the LEDs to the pedestal cooler. This thermal connection is such that heat can be conducted from the plurality of LEDs to the pedestal cooler along one or more heat flow pathways between these components. In some instances, the pedestal cooler is in direct contact with one or more elements of the substrate heater, while in other instances other conductive elements, such as thermally conductive plates (e.g., that comprise a metal) are interposed between the substrate heater and the pedestal cooler. Referring back to FIG. 1, the substrate heater includes a pedestal cooler 136 in direct contact with the bottom of the PCB 126. Heat is configured to flow from the LEDs, to the PCB 126, and to the pedestal cooler 136. The pedestal cooler 136 also includes a plurality of fluid conduits 138 through which a heat transfer fluid, such as water, is configured to flow in order to receive the heat and thus cool the LEDs in the substrate heater 122. The fluid conduits 138 may be connected to a reservoir and pump, not pictured, located outside the chamber. In some instances, the pedestal cooler may be configured to flow water that is cooled, such as between about 5° C. and 20° C.

As provided herein, it may be advantageous to actively heat the exterior surfaces of the processing chamber 102. In some instances, it may similarly be advantageous to heat the exterior surfaces of the pedestal 104 in order to prevent unwanted condensation and deposition on its external surfaces. As illustrated in FIG. 1, the pedestal 104 may further include a pedestal heater 144 inside of the pedestal 104 that is configured to heat the exterior surfaces of the pedestal 104, including its sides 142A and bottom 142B. The pedestal heater 144 may include one or more heating elements, such as one or more resistive heating elements and fluid conduits in which a heating fluid is configured to flow. In some instances, the pedestal cooler and the pedestal heater may both have fluid conduits that are fluidically connected to each other such that the same heat transfer fluid may flow in both the pedestal cooler and the pedestal heater. In these embodiments, the fluid may be heated to between 50° C. and 130° C. including about 90° C. and 120° C.

The pedestal may also include a window to protect the substrate heater, including the plurality of LEDs, from damage caused by exposure to the processing chemistries and pressures used during processing operations. As illustrated in FIG. 1, the window 150 may be positioned above the substrate heater 122 and may be sealed to the sidewall 149 of the pedestal 104 in order to create a plenum volume within the pedestal that is fluidically isolated from the chamber interior. This plenum volume may also be considered the inside of the bowl 146. The window may be comprised of one or more materials that are optically transparent to the visible light emitted by LEDs, including light having wavelengths in the range of 400 nm to 800 nm. In some embodiments, this material may be quartz, sapphire, quartz with a sapphire coating, or calcium fluoride (CaF). The window may also not have any holes or openings within it. In some embodiments, the heater may have a thickness of 15 to 30 mm, including 20 mm and 25 mm.

Figure 4:
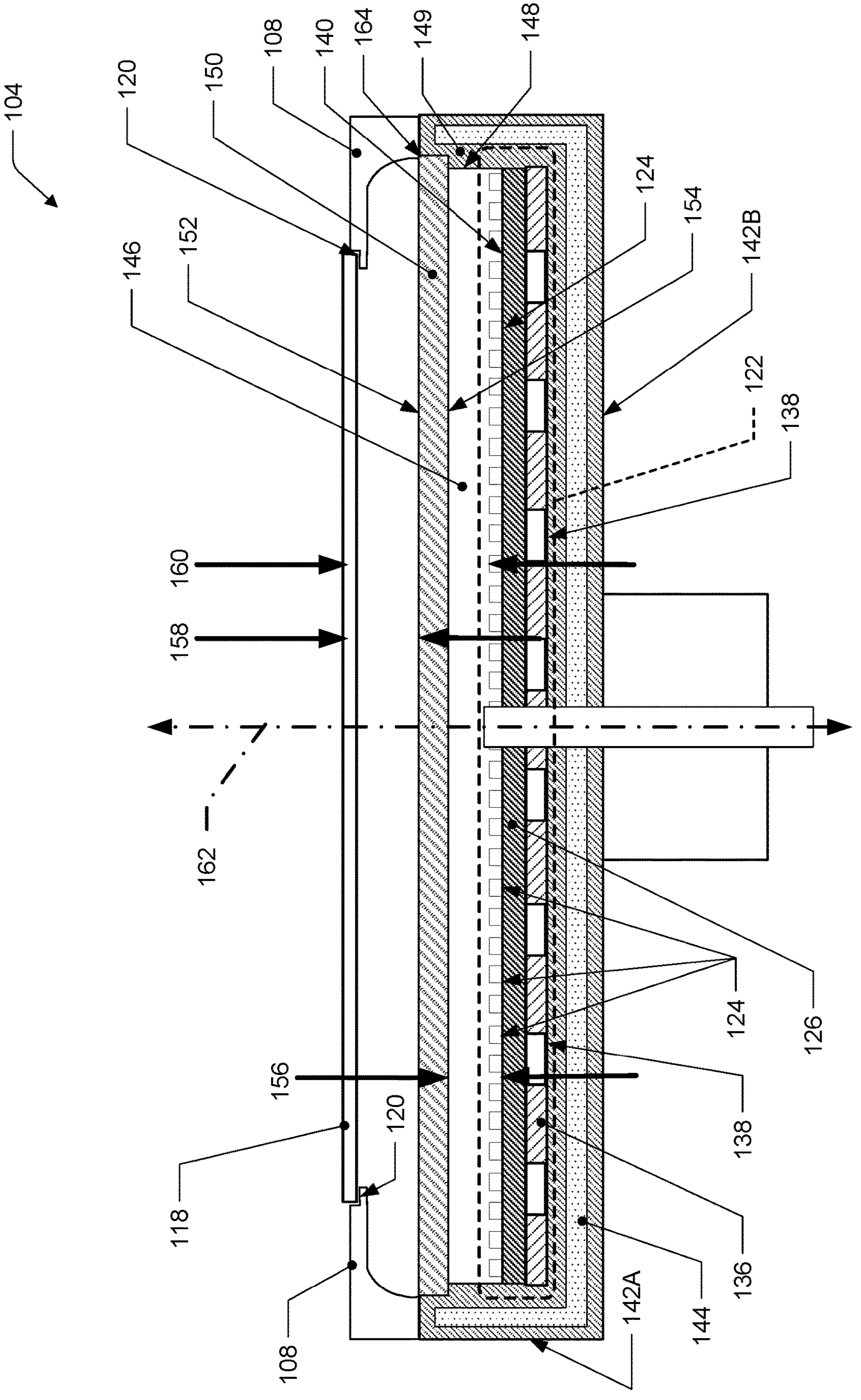
FIG. 4 depicts the pedestal of FIG. 1 with additional features in accordance with various embodiments.

FIG. 4 depicts the pedestal of FIG. 1 with additional features in accordance with various embodiments. As identified in FIG. 4, the window 150 includes a top surface 152 that faces the substrate 118 supported by the pedestal 104, and a bottom surface 154 that faces the substrate heater 122. In some embodiments, the top and the bottom surfaces 152 and 154 may be flat, planar surfaces (or substantially flat, e.g., within ±10% or 5% of flat). In some other instances, the top 152, bottom 154, or both top 152 and bottom 154 may be nonplanar surfaces. The nonplanarity of these surfaces may be configured to refract and/or direct the light emitted by the substrate heater's 122 LEDs 124 to more efficiently and/or effectively heat the wafer. The nonplanarity may also be along some or all of the surface. For example, the entire bottom surface may have a convex or concave curvature, while in another example an outer annular region of the bottom surface may have a convex or concave curvature while the remaining portion of the surface is planar. In further examples, these surfaces may have multiple, but different, nonplanar sections, such as having a conical section in the center of the surface that is adjacent to a planar annular section, that is adjacent to a conical frustum surface at the same or different angle as the conical section. In some embodiments, the window 150 may have features that act as an array of lenses which are oriented to focus the light emitted by one or more LEDs, such as each LED.

With the window 150 positioned above the substrate heater 122, the window 150 gets heated by the substrate heater 122 which can affect the thermal environment around the substrate. Depending on the material or materials used for the window 150, such as quartz, the window may retain heat and progressively retain more heat over the course of processing one or more substrates. This heat can get radiatively transferred to the substrate and therefore directly heat the substrate. In some instances, that the window can cause a temperature increase of between 50° C. and 80° C. above the heater temperature. This heat may also create a temperature gradient through the thickness, or in the vertical direction, of the window. In some instances, the top surface 152 is 30° C. hotter than the bottom surface 154. It may therefore be advantageous to adjust and configure the chamber to account for and reduce the thermal effects of the window. As described in more detail below, this may include detecting the substrate's temperature and adjusting the substrate heater to account for the heat retained by the window.

Figure 14:
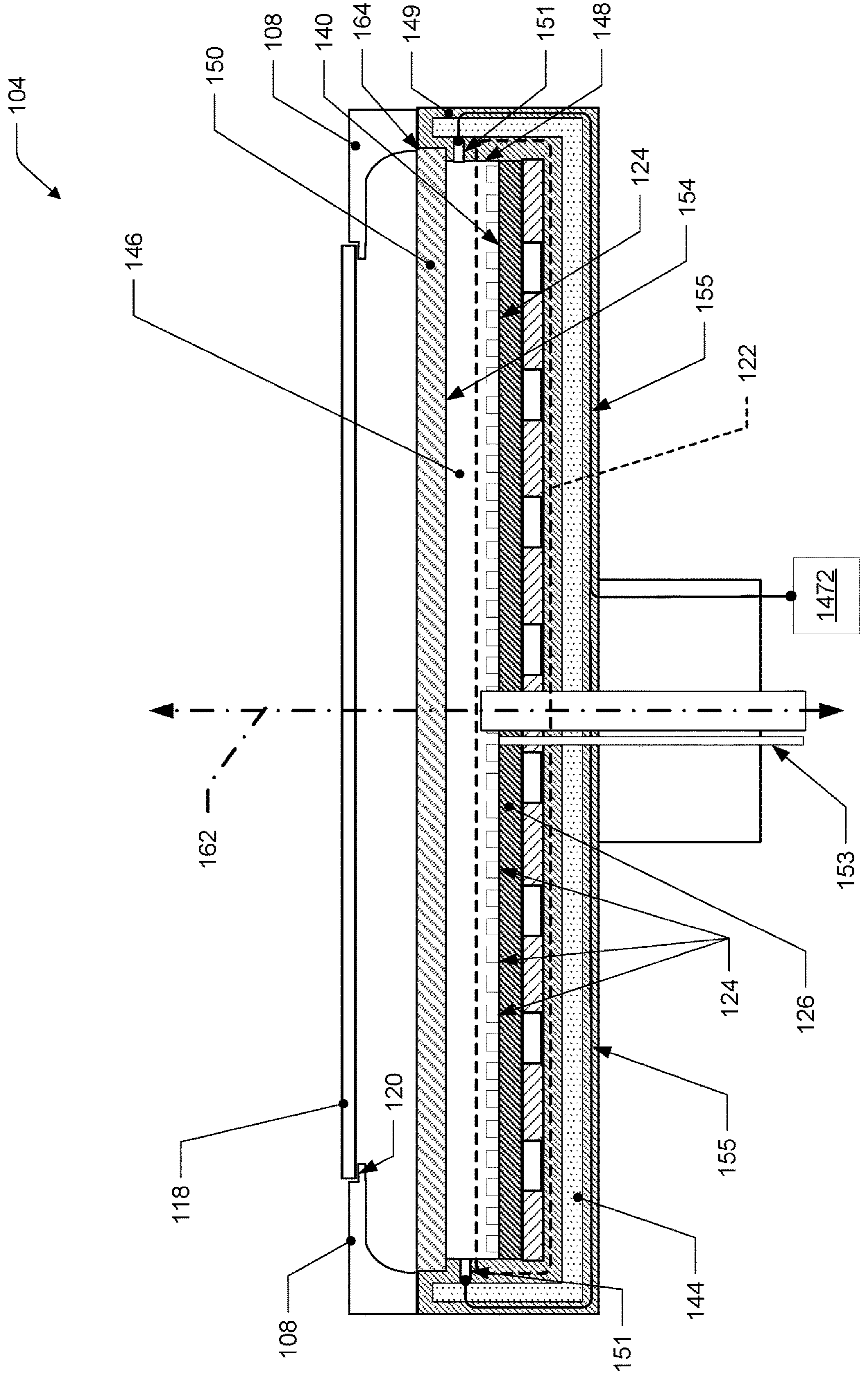
FIG. 14 depicts the pedestal of FIG. 4 with additional features in accordance with various embodiments.

This may also include various configurations of the pedestal, such as actively cooling the window. In some embodiments, like that shown in FIGS. 1 and 4, the window 150 may be offset from the substrate heater 122 by a first distance 156. In some embodiments, this first distance may be between about 2 mm and 50 mm, including between about 5 mm and 40 mm. A cooling fluid, such as an inert gas, may be flowed between the window 150 and the substrate heater 122 in order to cool both the window 150 and the substrate heater 122. The pedestal may have one or more inlets and one or more outlets for flowing this gas within the plenum volume, or bowl 146, of the pedestal 104. The one or more inlets are fluidically connected to the inert gas source outside the chamber 102, which may include through fluid conduits that may be at least partially routed inside the pedestal 104. The one or more outlets are fluidically connected to an exhaust or other environment outside the chamber 102, which may also be through fluid conduits running within the pedestal. In FIG. 14, which depicts the pedestal of FIG. 4 with additional features in accordance with various embodiments, one or more inlets 151 are positioned in the sidewalls 149 and extend through the surface 148; the one or more inlets are also fluidically connected to an inert gas source 1472 through, in part, fluid conduits 155 that are routed through the pedestal 104. A single outlet 153 is positioned in a center region, i.e., not in the exact center but in close proximity, of the substrate heater 122. In some embodiments, the one or more gas inlets and one or more outlets may be switched, such that the one or more outlets extend through the sidewalls 149 (i.e., they are items 151 in FIG. 14), and the one or more inlets may be the center region of the substrate heater 122 (i.e., they are item 153 in FIG. 14). In some embodiments, there may be more than one outlet; in some embodiments, there may only be a single gas inlet. In some embodiments, one or more gas inlets extend through the interior surface 148 of the pedestal sidewall 149 underneath the LED heater 122 and one or more gas outlets extend through another part of the pedestal sidewall 149, such as a mounting bracket between the LED heater 122 and the pedestal sidewall 149.

In some embodiments, the window may be placed in direct, thermal contact with the substrate heater and the pedestal cooler may be configured to cool both the PCB and the window. In some embodiments, as also shown in FIGS. 1 and 4, the window 150 may be thermally connected to the sidewalls 149 of the pedestal 104 in order to transfer some of the retained heat in the window 150 to the pedestal 104. This transferred heat may be further transferred out of the pedestal using, for instance, the pedestal heater 144 which may flow fluid through the pedestal 104 that is heated to between about 20° C. and 100° C., for instance. This heated fluid may be cooler than the temperature of the pedestal 104 at the thermal connection with the window 150. In some embodiments, the window 150 may have one or more fluid conduits within the window 150 through which transparent cooling fluid may be configured to flow. These conduits may be of various arrangements in order to provide even cooling and temperature distribution within the window, such as a single flowpath with a single inlet, a single outlet, and a serpentine section. The fluid may be routed to the window through the pedestal from a fluid source or reservoir outside the chamber.

As shown in FIGS. 1 and 4, the pedestal's 104 substrate supports 108 are configured to support the substrate 118 above and offset from the window 150 and the substrate heater 122. In certain embodiments, the temperature of the substrate can be rapidly and precisely controlled by thermally floating, or thermally isolating, the substrate within the chamber. The heating and cooling of a substrate is directed at both the substrate's thermal mass and the thermal masses of other items in contact with the substrate. For instance, if the substrate is in thermal contact with a large body, such as the entirety of the substrate's back side resting on a large surface of a pedestal or electrostatic chuck as in many conventional etching apparatuses, this body acts as a heat sink for the substrate which affects the ability to accurately control the substrate temperature and reduces the quickness of substrate heating and cooling. It is therefore desirable to position the substrate so that the smallest thermal mass is heated and cooled. This thermal floating is configured to position the substrate so that it has minimal thermal contact (which includes direct and radiation) with other bodies in the chamber.

The pedestal 104 is therefore configured, in some embodiments, to support the substrate 118 by thermally floating, or thermally isolating, the substrate within the chamber interior 114. The pedestal's 104 plurality of substrate supports 108 are configured to support the substrate 118 such that the thermal mass of the substrate 118 is reduced as much as possible to the thermal mass of just the substrate 118. Each substrate support 108 may have a substrate support surface 120 that provides minimal contact with the substrate 118. The number of substrate supports 108 may range from at least 3 to, for example, at least 6 or more. The surface area of the support surfaces 120 may also be the minimum area required to adequately support the substrate during processing operations (e.g., in order to support the weight of the substrate and prevent inelastic deformation of the substrate). In some embodiments, the surface area of one support surface 120 may be less than about 0.1%, less than about 0.075%, less than about 0.05%, less than about 0.025%, or less than about 0.01%, for instance.

The substrate supports are also configured to prevent the substrate from being in contact with other elements of the pedestal, including the pedestal's surfaces and features underneath the substrate. As seen in FIGS. 1 and 4, the substrate supports 108 hold the substrate 118 above and offset from the next adjacent surface of the pedestal 104 below the substrate 118, which is the top surface 152 (identified in FIG. 4) of the window 150. As can be seen in these Figures, a volume or gap exists underneath the substrate, except for the contact with the substrate supports. As illustrated in FIG. 4, the substrate 118 is offset from the top surface 152 of the window 150 by a distance 158. This distance 158 may affect the thermal effects caused by the window 150 to the substrate 118. The larger the distance 158, the less the effects. It was found that a distance 158 of 2 mm or less resulted in a significant thermal coupling between the window and the substrate; it is therefore desirable to have a larger distance 158 than 2 mm, such as at least about 5 mm, about 10 mm, about 15 mm, about 20 mm, about 30 mm, about 50 mm, or about 100 mm, for example.

The substrate 118 is also offset from the substrate heater 122 (as measured in some instances from a top surface of the substrate heater 122 which may be the top surface of the LEDs 124) by a distance 160. This distance 160 affects numerous aspects of heating the substrate 118. In some instances, the LEDs 124 provide a nonuniform heating pattern, which increases as the distance 160 decreases; conversely, this nonuniform heating pattern is reduced by increasing the distance 160. In some instances as the distance 160 increases, the heating efficiency decreases across the substrate and decreases more in the edge region and causes nonuniform heating of the substrate. In some embodiments, a distance 160 of between about 10 mm and 90 mm, about 5 mm and 100 mm, including between 10 mm and 30 mm, for instance, provides a substantially uniform heating pattern and acceptable heating efficiency.

As stated, the substrate supports 108 are configured to support the substrate 118 above the window. In some embodiments, these substrate supports are stationary and fixed in position; they are not lift pins or a support ring. In some embodiments, at least a part of each substrate support 108 that includes the support surface 120 may be comprised of a material that is transparent at least to light emitted by LEDS 124. This material may be, in some instances, quartz or sapphire. The transparency of these substrate supports 108 may enable the visible light emitted by the substrate heater's 122 LEDs to pass through the substrate support 108 and to the substrate 118 so that the substrate support 108 does not block this light and the substrate 118 can be heated in the areas where it is supported. This may provide a more uniform heating of the substrate 118 than with a substrate support comprising a material opaque to visible light. In some other embodiments, the substrate supports 108 may be comprised of a non-transparent material, such as zirconium dioxide ($ZrO_2$).

In some embodiments, such as those shown in FIG. 4, the substrate supports 108 may be positioned closer to a center axis 162 of the window than the outer diameter 164 of the window 150. In some instances, portions of these substrate supports may extend over and above the window 150 such that they overlap the window 150 such that the support surfaces 120 are above the window 150.

Figure 5:
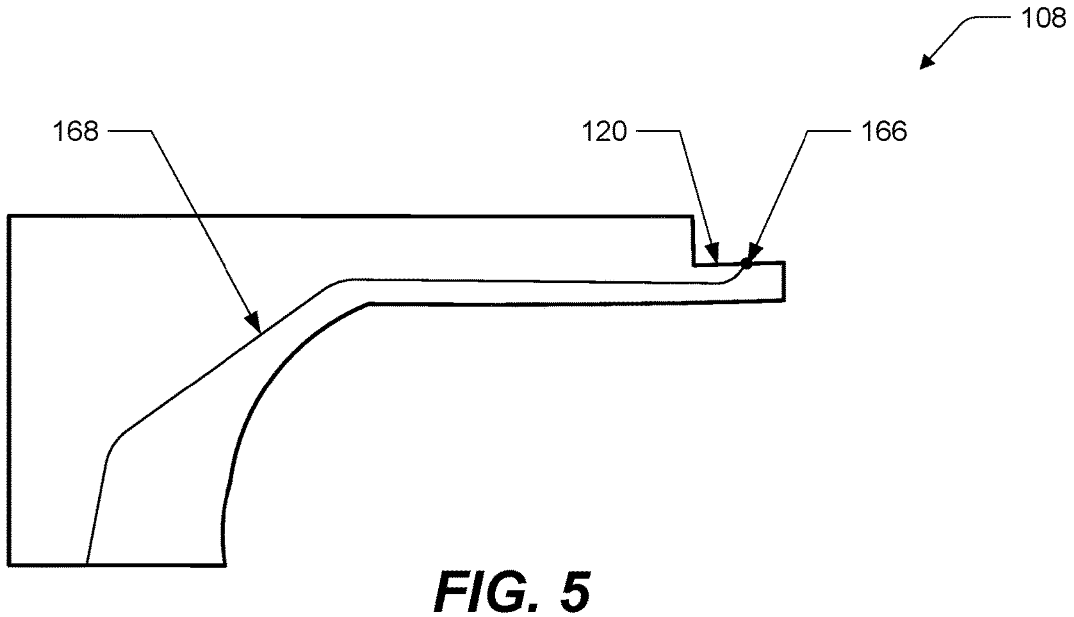
FIG. 5 depicts a substrate support of FIGS. 1 and 4 in accordance with disclosed embodiments.

In some embodiments, the substrate supports may each contain a temperature sensor that is configured to detect the temperature of the substrate positioned on the support surface of the substrate supports. FIG. 5 depicts a substrate support of FIGS. 1 and 4 in accordance with disclosed embodiments. Here, the support surface 120 of the substrate support 108 is identified, along with a temperature sensor 166. In some embodiments, this temperature sensor 166 extends through the support surface 120 such that the temperature sensor 166 is in direct contact with a substrate held by the support surface 120. In some other embodiments, the temperature sensor 166 is positioned within the substrate support 108 and below the support surface 120. In some embodiments, this temperature sensor 166 is a thermocouple. In some other embodiments, the temperature sensor 166 may be a thermistor, a resistance temperature detector (RTD), and semiconductor sensor. The electrical wiring 168 for the temperature sensor 166 may be routed through the substrate support 108 and may also be routed through the pedestal 104.

Referring back to FIG. 1, in some embodiments, the pedestal is also configured to move vertically. This may include moving the pedestal such that a gap 186 between a faceplate 176 of the gas distribution unit 110 and the substrate 118 is capable of being in a range of 2 mm and 70 mm. As provided in more detail below, moving the pedestal vertically may enable active cooling of the substrate as well as rapid cycling time of processing operations, including flowing gas and purging, due to a low volume created between the gas distribution unit 110 and the substrate 118. This movement may also enable the creation of a small process volume between the substrate and the gas distribution unit which can result in a smaller purge and process volume and thus reduce purge and gas movement times and increase throughput.

The gas distribution unit 110 is configured to flow process gases, which may include liquids and/or gases, such as a reactant, modifying molecules, converting molecules, or removal molecules, onto the substrate 118 in the chamber interior 114. As seen in FIG. 1, the gas distribution unit 110 includes one or more fluid inlets 170 that are fluidically connected to one or more gas sources 172 and/or one or more vapor sources 174. In some embodiments, the gas lines and mixing chamber may be heated to prevent unwanted condensation of the vapors and gases flowing within. These lines may be heated to at least about 40° C., at least about 80° C., at least about 90° C., at least about 120° C., at least about 130° C., or at least about 150° C. The one or more vapor sources may include one or more sources of gas and/or liquid which is vaporized. The vaporizing may be a direct inject vaporizer, a flow over vaporizer, or both. The gas distribution unit 110 also includes the faceplate 176 that includes a plurality of through-holes 178 that fluidically connect the gas distribution unit 110 with the chamber interior 114. These through-holes 178 are fluidically connected to the one or more fluid inlets 170 and also extend through a front surface 177 of the faceplate 176, with the front surface 177 configured to face the substrate 118. In some embodiments, the gas distribution unit 110 may be considered a top plate and in some other embodiments, it may be considered a showerhead.

The through-holes 178 may be configured in various ways in order to deliver uniform gas flow onto the substrate. In some embodiments, these through-holes may all have the same outer diameter, such as between about 0.03 inches and 0.05 inches, including about 0.04 inches (1.016 mm). These faceplate through-holes may also be arranged throughout the faceplate in order to create uniform flow out of the faceplate.

Figure 6:
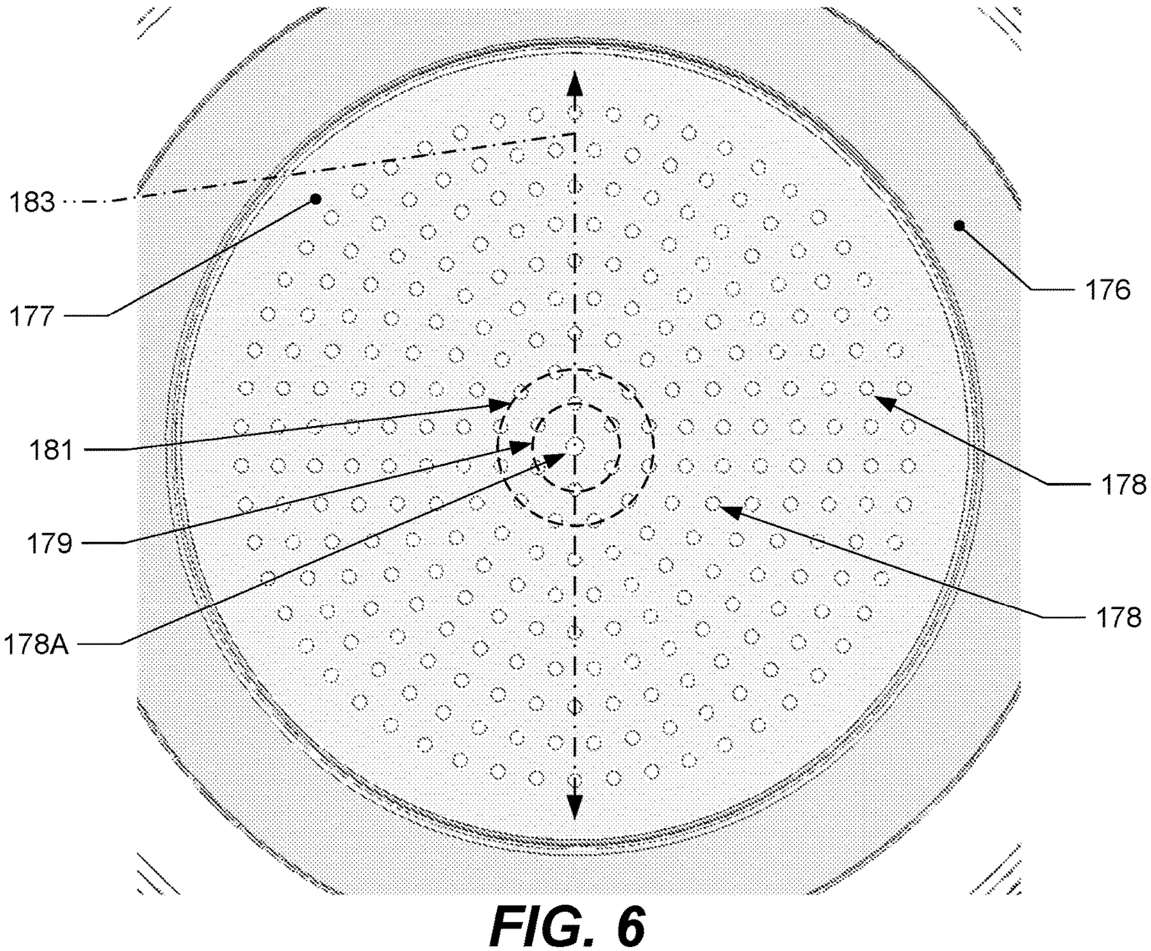
FIG. 6 depicts a plan view of first example faceplate.

FIG. 6 depicts a plan view of first example faceplate 176 with the front surface 177 (the surface configured to face a substrate) and the through-holes 178 visible. As can be seen, the faceplate 176 through-holes 178 extend through the faceplate 176 and the front surface 177. These through-holes are also arranged along multiple circles that are centered around the center axis of the faceplate, thereby offsetting the holes from each other. For example, the faceplate 176 may have a through-hole 178A that is centered on the center axis of the faceplate 176. Immediately adjacent to this center through-hole 178A may be a plurality of holes arranged equally spaced along a first circle 179 with a first diameter; immediately radially outwards from this circle may be another circle 181 with a second plurality of holes having more holes than the plurality of holes, and this second plurality of holes may be equally spaced along this second circle. This equal spacing may not always be exact and may be considered substantially equally spaced, which may be due to manufacturing or other inconsistencies, such that the spacing may be within about +/−5% of equal. As illustrated, some circles of through-holes 178 may be centered on a referential datum 183, while other circles of the through-holes are offset from the referential datum 183 by an angle, such as about 15°, 7.5°, etc. Here, the through-holes along the first circle 179 two through-holes centered on the datum, while the through-holes along the second circle are not centered on the referential datum 183 and are offset from the datum 183 by about 15°. The concentric circles of through-holes may alternate between holes centered on the datum 183 and offset from the datum 183.

Figure 7:
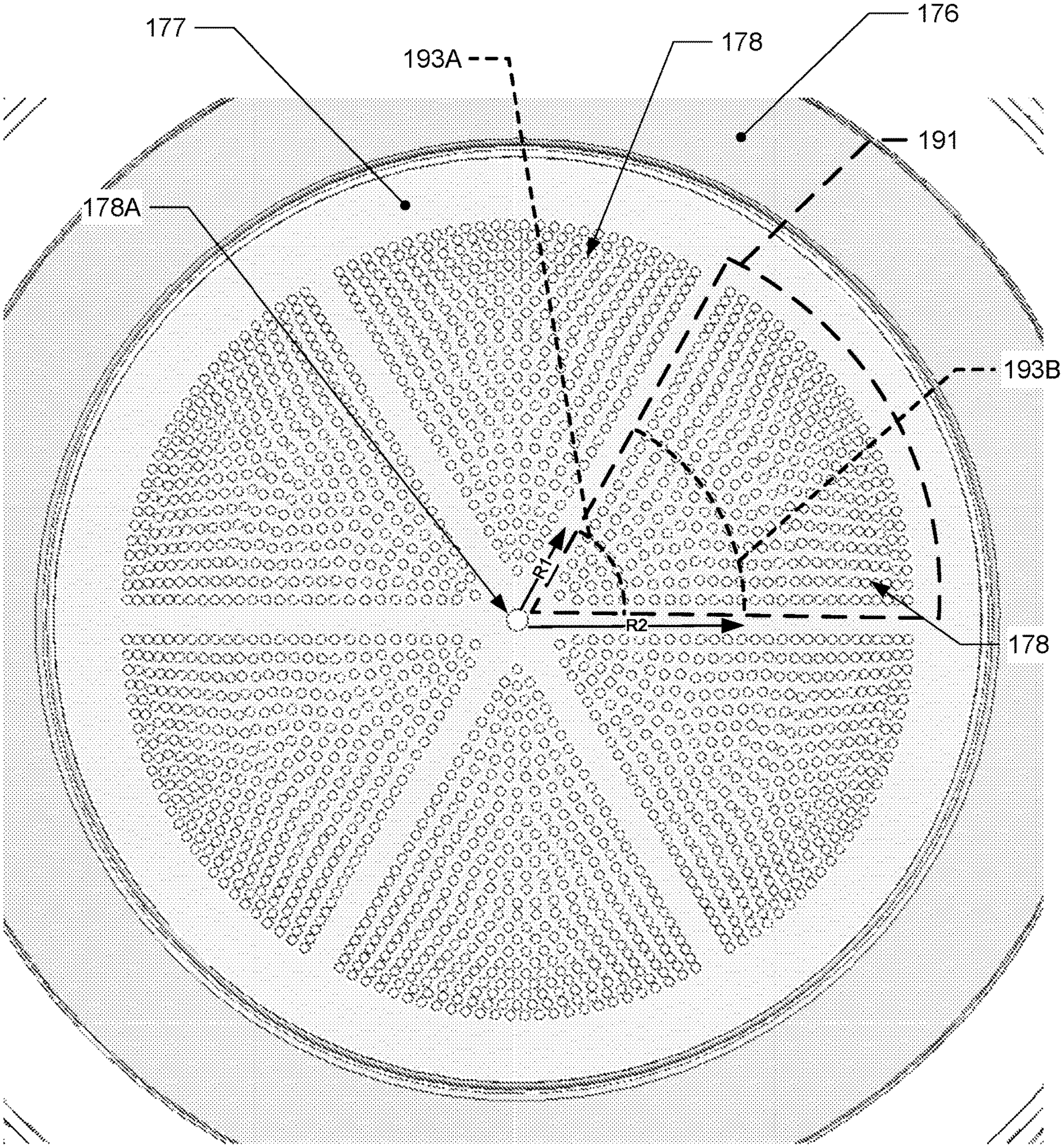
FIG. 7 depicts a plan view of second example faceplate.

FIG. 7 depicts a plan view of second example faceplate 176 with the front surface 177 (the surface configured to face a substrate) and the through-holes 178 visible. As can be seen, the faceplate 176 through-holes 178 extend through the faceplate 176 and the front surface 177. These through-holes are arranged different than in FIG. 6, with one through-hole 178 centered on the center axis of the faceplate 176, and the through-holes 178 arranged in 6 sectors, such that in each sector, the through-holes are equally spaced along arcs in the sector. For instance, one sector 191 is contained with a dashed shape and the holes are arranged along a plurality of arcs within the sector that increase as their radial distance from the center of the faceplate 176 increases. A first example arc 193A is identified along which 6 through-holes 178 are equally spaced, and a second example arc 193B is identified along which 12 through-holes are equally spaced. The second example arc 193B is larger than the first example arc 193A and has a greater radial distance R2 than the first arc's 193A radial distance R1.

Referring back to FIG. 1, the gas distribution unit 110 may also include a unit heater 180 that is thermally connected to the faceplate 176 such that heat can be transferred between the faceplate 176 and the unit heater 180. The unit heater 180 may include fluid conduits in which a heat transfer fluid may be flowed. Similar to above, the heat transfer fluid may be heated to a temperature range of about 20° C. and 120° C., for example. In some instances, the unit heater 180 may be used to heat the gas distribution unit 110 to prevent unwanted condensation of vapors and gases; in some such instances, this temperature may be at least about 90° C. or 120° C.

In some embodiments, the gas distribution unit 110 may include a second unit heater 182 that is configured to heat the faceplate 176. This second unit heater 182 may include one or more resistive heating elements, fluid conduits for flowing a heating fluid, or both. Using two heaters 180 and 182 in the gas distribution unit 110 may enable various heat transfers within the gas distribution unit 110. This may include using the first and/or second unit heaters 180 and 182 to heat the faceplate 176 in order to provide a temperature-controlled chamber, as described above, in order to reduce or prevent unwanted condensation on elements of the gas distribution unit 110.

The apparatus 100 may also be configured to cool the substrate. This cooling may include flowing a cooling gas onto the substrate, moving the substrate close to the faceplate to allow heat transfer between the substrate and the faceplate, or both. Actively cooling the substrate enables more precise temperature control and faster transitions between temperatures which reduces processing time and improves throughput. In some embodiments, the first unit heater 180 that flows the heat transfer fluid through fluid conduits may be used to cool the substrate 118 by transferring heat away from the faceplate 176 that is transferred from the substrate 119. A substrate 118 may therefore be cooled by positioning it in close proximity to the faceplate 176, such as by a gap 186 of less than or equal to 5 mm or 2 mm, such that the heat in the substrate 118 is radiatively transferred to the faceplate 176, and transferred away from the faceplate 176 by the heat transfer fluid in the first unit heater 180. The faceplate 176 may therefore be considered a heat sink for the substrate 118 in order to cool the substrate 118.

In some embodiments, the apparatus 100 may further include a cooling fluid source 173 which may contain a cooling fluid (a gas or a liquid), and a cooler (not pictured) configured to cool the cooling fluid to a desired temperature, such as less than or equal to at least about 90° C., at least about 70° C., at least about 50° C., at least about 20° C., at least about 10° C., at least about 0° C., at least about −50° C., at least about −100° C., at least about −150° C., at least about-190° C., at least about −200° C., or at least about −250° C., for instance. The apparatus 100 includes piping to deliver the cooling fluid to the one or more fluid inlets 170, and the gas distribution unit 110 which is configured to flow the cooling fluid onto the substrate. In some embodiments, the fluid may be in liquid state when it is flowed to the chamber 102 and may turn to a vapor state when it reaches the chamber interior 114, for example if the chamber interior 114 is at a low pressure state, such as described above, e.g., between about 0.1 Torr and 10 Torr, or between about 0.1 Torr and 100 Torr, or between about 20 Torr and 200 Torr, for instance. The cooling fluid may be an inert element, such as nitrogen, argon, or helium. In some instances, the cooling fluid may include, or may only have, a non-inert element or mixture, such as hydrogen gas. In some embodiments, the flow rate of the cooling fluid into the chamber interior 114 may be at least about 0.25 liters per minute, at least about 0.5 liters per minute, at least about 1 liters per minute, at least about 5 liters per minute, at least about 10 liters per minute, at least about 50 liters per minute, or at least about 100 liters per minute, for example. In certain embodiments, the apparatus may be configured to cool a substrate at one or more cooling rates, such as at least about 5° C./second, at least about 10° C./second, at least about 15° C./second, at least about 20° C./second, at least about 30° C./second, or at least about 40° C./second.

Figure 8:
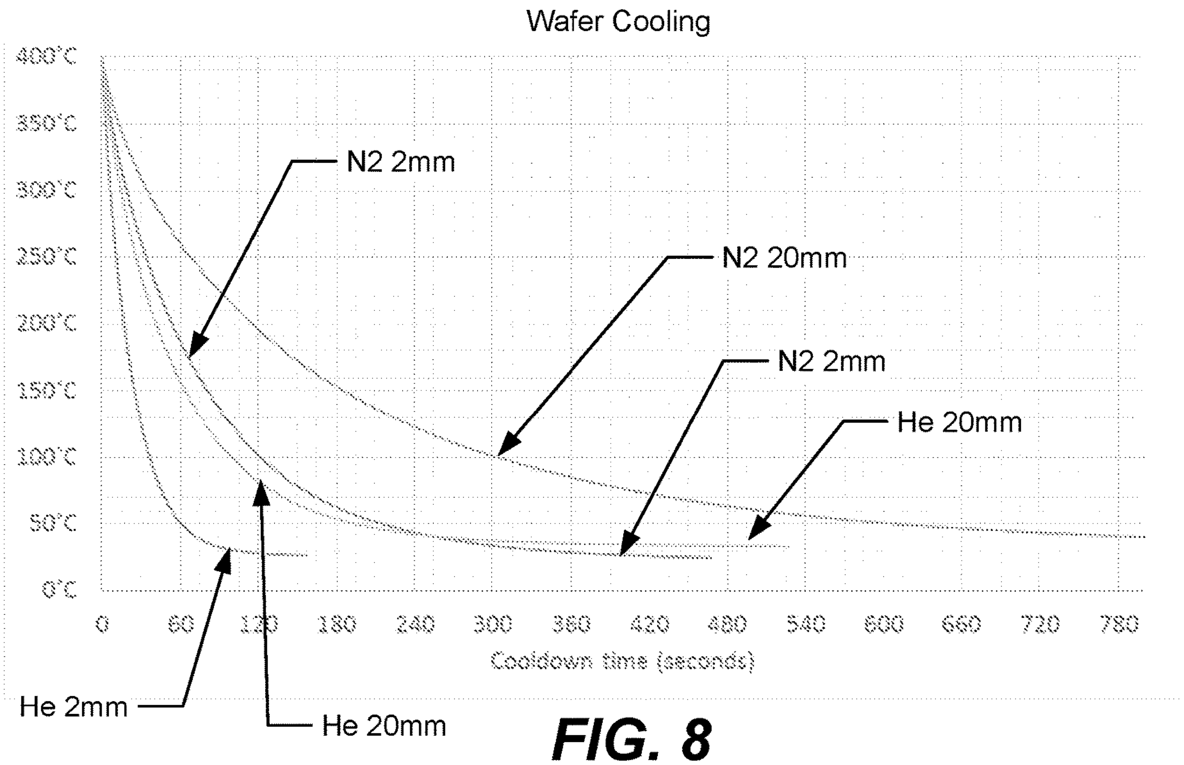
FIG. 8 depicts a graph of four different active cooling experiments.

In some embodiments, the apparatus 100 may actively cool the substrate by both moving the substrate close to the faceplate and flowing cooling gas onto the substrate. In some instances, the active cooling may be more effective by flowing the cooling gas while the substrate is in close proximity to the faceplate. The effectiveness of the cooling gas may also be dependent on the type of gas used. FIG. 8 depicts a graph of four different active cooling experiments. In these four experiments the substrate was cooled from about 400° C. to about 25° C. using different gases and gaps between the substrate and the faceplate. In the first experiment, a 400° C. substrate was actively cooled by positioning the substrate 2 mm away from the faceplate and flowing helium gas onto the substrate ("He 2 mm"), in the second experiment, the 400° C. substrate was actively cooled by positioning the substrate 20 mm away from the faceplate and flowing helium gas onto the substrate ("He 20 mm"), in the third experiment, the 400° C. substrate was actively cooled by positioning the substrate 2 mm away from the faceplate and flowing nitrogen gas onto the substrate ("N2 2 mm"), and in the fourth experiment the 400° C. substrate was actively cooled by positioning the substrate 20 mm away from the faceplate and flowing nitrogen gas onto the substrate ("N2 20 mm"). As can be seen, the first experiment cooled the substrate in the fastest time, approximately 150 seconds, and the third experiment was the next fastest at approximately 450 seconds. These first and third experiments used both cooling gas and a gap of 2 mm, while the slower second and fourth experiments had a 20 mm gap.

Figure 9:
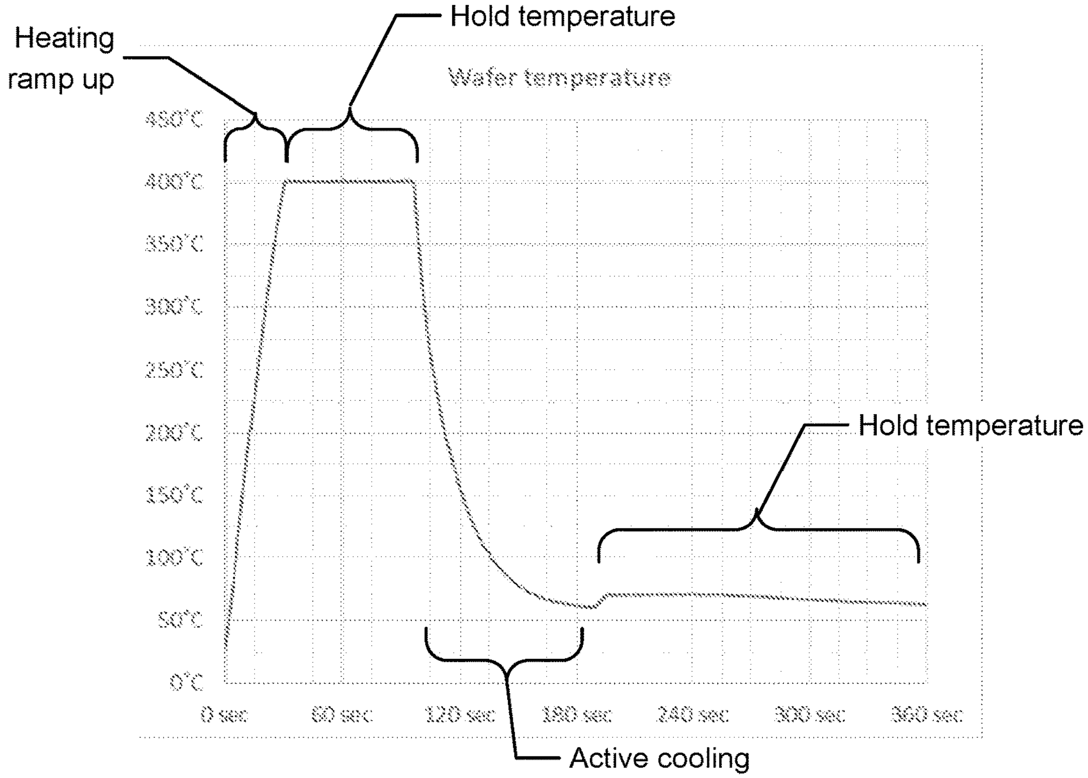
FIG. 9 provides an example temperature control sequence.

The apparatuses provided herein can therefore rapidly heat and cool a substrate. FIG. 9 provides an example temperature control sequence. At time 0, the substrate is at approximately 20 or 25° C., and the LEDs of the substrate heater provided herein emit the visible light having wavelengths between 400 nm and 800 nm and cause the substrate temperature to rise to about 400° C. in approximately 30 seconds. This heating was accomplished using between 1 kW and 2 kW of heating power that is provided by approximately 9 kW of supplied power to the substrate heater. From about 30 seconds to about 95 seconds, the substrate heater 122 held the substrate at 400° C. using less power, such as 0.3 to about 0.5 kW of heating power provided by approximately 2 kW of supplied power. For about 30 to 60 seconds, the substrate was actively cooled using both cooling gas flowed onto the substrate (e.g., hydrogen or helium) and heat transfer to the faceplate. Once cooled, the substrate heater heated the substrate to hold its temperature at approximately 70° C. using between about 10 and 30 W of heating power provided by about 100 W of supplied power. Various processing techniques may use this type of sequence, either once or repeatedly, for processing a substrate.

In some embodiments, the apparatus 100 may include a mixing plenum for blending and/or conditioning process gases for delivery before reaching the fluid inlets 170. One or more mixing plenum inlet valves may control introduction of process gases to the mixing plenum. In some other embodiments, the gas distribution unit 110 may include one or more mixing plenums within the gas distribution unit 110. The gas distribution unit 110 may also include one or more annular flow paths fluidically connected to the through-holes 178 which may equally distribute the received fluid to the through-holes 178 in order to provide uniform flow onto the substrate.

The apparatus 100 may also include one or more additional non-contact sensors for detecting the temperature of the substrate. One such sensor may be a new pyrometer that is capable of detecting numerous temperature ranges of a silicon substrate. It is desirable to detect the temperature of substrates having different treatments, e.g., whether the silicon is doped or not doped, at different temperatures ranges at which processing operations may occur, such as under about 200° C., greater than about 200° C. and less than about 600° C., or above 600° C. However, some pyrometers are not able to detect different substrates within these ranges. Some pyrometers measure the optical signals reflected or emitted by an object's surface to determine the object's temperature according to some calibration. However, many silicon wafers cannot be measured by these pyrometers because the silicon is optically transparent at various temperatures and with various treatments. As discussed above, FIG. 13 shows different absorption rates for substrates at various temperatures. For example, some pyrometers is capable of detecting emissions in a range of about 8-15 microns, but most silicon substrates under at least about 200° C. do not have an consistent emission signal in the range of about 8-15 microns and are therefore undetectable by some pyrometers when under about 200° C.

lightly doped, or undoped, silicon substrates have an emission signal from approximately 0.95 to 1.1 microns when the substrates are at or below about 300° C., that doped silicon substrates have an emission signal between about 1 and 4 microns when the substrates are below about 200° C., that silicon substrates have an emission signal at approximately 1 micron when around room temperature, such as under about 100° C. including, for instance 20° C., and that silicon substrates have an emission signal of about 8 to 15 microns when at temperatures over about 600° C. The new pyrometer is therefore configured to detect multiple emission ranges in order to detect multiple substrates, e.g., doped, low doped, or not doped, at various temperature ranges. This includes the configuration to detect emission ranges of about 0.95 microns to about 1.1 microns, about 1 micron, about 1 to about 4 microns, and/or about 8 to 15 microns. The new pyrometer is also configured to detect the temperature of a substrate at a shorter wavelength in order to differentiate the signal from the thermal noise of the chamber.

The new pyrometer may include an emitter configured to emit infrared signals and a detector configured to receive emissions. Referring to FIG. 1, the apparatus includes the new pyrometer 188 having an emitter within the pyrometer 188 and a detector 190. The new pyrometer may be configured to emit signals on one side of the substrate, either the top or the bottom, and configured to receive signals on the other side of the substrate. For instance, the emitter may emit signals on the top of the substrate and the detector is under the substrate and receives signals emitted through and under the substrate. The apparatus may therefore have at least a first port 192A on the top of the chamber 102, such as the port 192A through the center of the gas distribution unit 110, and a second port 192B through the pedestal 104 and substrate heater 122. The emitter in the pyrometer 188 may be connected to one of the ports 192A or 192B via a fiberoptic connection, such as the first port 192A as shown in FIG. 1, and the detector is optically connected to the other port, such as the second port 192B in FIG. 1. The first port 192A may include a port window 194 to seal the first port 192A from the chemistries within the chamber interior 114. The second port 192B is seen in FIG. 1 extending through the pedestal 104 and the substrate heater such that the emitter's emissions can pass through the substrate, through the window 150, into the second port 192B and to the detector 190 that may be positioned in the second port or optically connected to the second port through another fiberoptic connection (not shown). In some other embodiments, the emitter and the detector are flipped, such that the emitter emits through the second port 192B and the detector detects through the first port 192A.

The apparatus 100 may also include one or more optical sensors 198 to detect one or more metrics of the visible light emitted by the LEDs. In some embodiments, these optical sensors may be one or more photodetectors configured to detect the light and/or light intensity of the light emitted by the LEDs of the substrate heater. In FIG. 1, a single optical sensor 198 is shown as connected to the chamber interior 114 via fiberoptic connection such that the optical sensor 198 is able to detect light emitted by the substrate heater 122. The optical sensor 198, and additional optical sensors, can be positioned in various locations in the top and sides, for instance, of the chamber 102 in order to detect the emitted light at various locations within the chamber 102. As discussed below, this may enable the measurement and adjustment of the substrate heater, such as the adjustment of one or more independently controllable zones of the LEDs. In some embodiments, there may be a plurality of optical sensors 198 arranged along a circle or multiple concentric circles in order to measure various regions of the LEDs throughout the chamber 102. In some embodiments, the optical sensors may be positioned inside the chamber interior 114.

In some embodiments, the apparatus may further be configured to generate a plasma and use the plasma for some processing in various embodiments. This may include having a plasma source configured to generate a plasma within the chamber interior, such as a capacitively coupled plasma (CCP), an inductively coupled plasma (ICP), an upper remote plasma, and a lower remote plasma.

The apparatuses described herein are not limited to ALE etching operations. These apparatuses may be used with any etching technique.

Techniques for Thermal Processing

Figure 10:
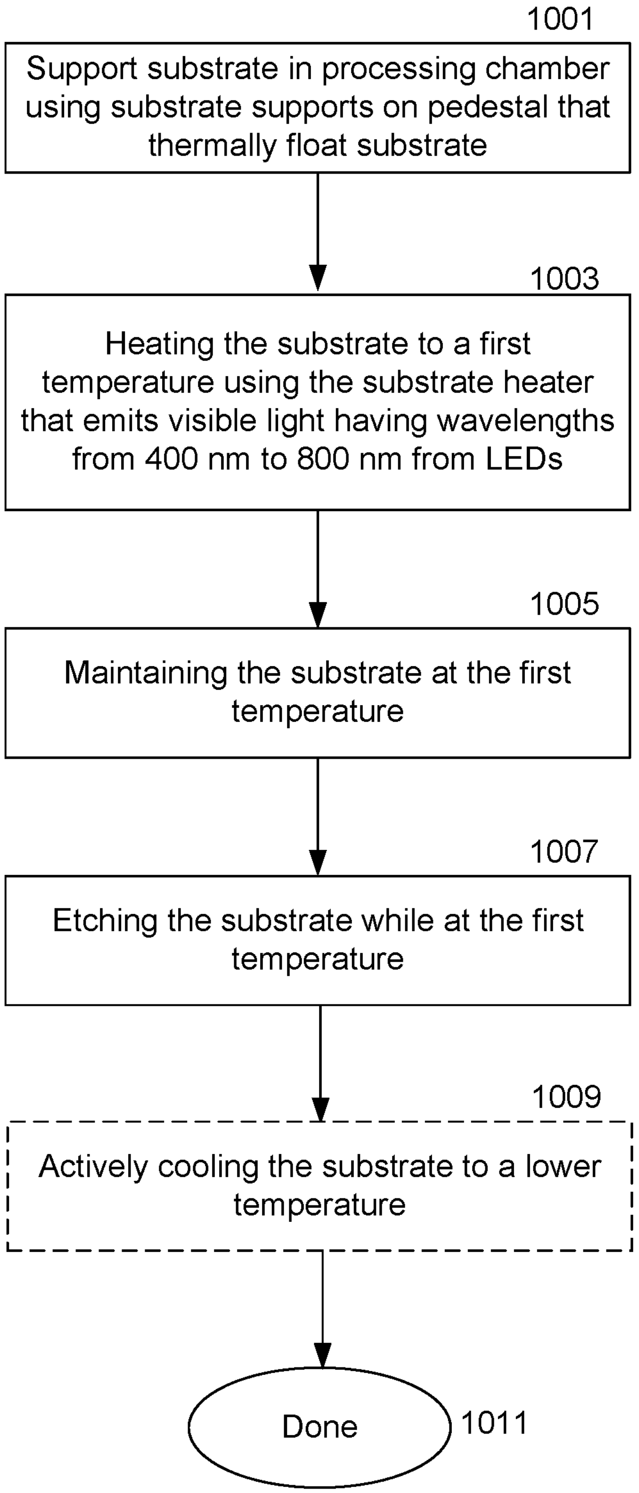
FIG. 10 depicts a first technique for thermal processing in accordance with disclosed embodiments.

Various techniques for using the apparatuses described herein will now be described. FIG. 10 depicts a first technique for thermal processing in accordance with disclosed embodiments. In operation 1001, the substrate is provided to the chamber and thermally floated in the chamber by positioning the substrate on the substrate supports of the pedestal; as described above, only the substrate support contact the substrate; it is not in contact with other elements of the processing chamber. Each substrate support contacts the edge region of the substrate as provided herein and shown in FIGS. 1 and 4, for instance.

In operation 1003, the substrate is heated to a first temperature while it is thermally floated in the chamber, i.e., while it is supported by only the substrate supports, using the substrate heater described herein that emits visible light having wavelengths between 400 nm and 800 nm from the plurality of LEDs. The first temperature may be any temperature provided herein, including between about 50° C. and about 600° C., including between about 50° C. and about 150° C., including about 130° C., or between about 150° C. and about 350° C., for example. The substrate may be rapidly heated to the first temperature, such as in less than about 60 seconds, less than about 45 seconds, less than about 30 seconds, or less than about 15 seconds, for instance. This may include powering the LEDs to their maximum power, which together may be greater than or equal to at least about 1 kW, at least about 2 kW, at least about 3 kW, at least about 4 kW, or at least about 9 kW of delivered power. As provided herein, this heating does not include a plasma or plasma generation.

In operation 1005, the substrate is maintained at the first temperature. This may include the substrate heater operating at lower power in order to maintain the substrate at a specific temperature. The LEDs may therefore be at a lower non-zero power level than during a temperature ramp up to provide some heating and maintain the substrate at the desired temperature. Examples may include between about 5 W and about 0.5 kW, including at least about 10 W, at least about 30 W, at least about 0.3 kW, or at least about 0.5 kW.

In operation 1007, the substrate is etched while at the first temperature. This etching may include flowing one or more gases to remove one or more modified layers of material. This etching also does not include a plasma or plasma generation.

In operation 1009, which may be optional in some embodiments, the substrate is actively cooled. This active cooling may include flowing the cooling the gas onto the substrate, moving the substrate in close proximity to the faceplate, or both as described herein. In some instances, this close proximity is less than or equal 5 mm, including 2 mm. The cooling gas may also include, for example, helium and nitrogen. Following operation 1009, in some instances, operations 1003 through 1009 may be repeated, with each sequence being considered a cycle.

In some embodiments, operations 1003, 1005, and 1007 may also be performed while the chamber walls, the faceplate, and/or the external surfaces of the pedestal are actively heated as described above. These items may be heated to between about 40° C. and about 150° C., including between about 80° C. and about 130° C., at least about 90° C. or at least about 120° C. Operations 1003, 1005, 1007, and 1009 may also be performed while the chamber interior is at a vacuum, which may be a pressure between about 0.1 Torr and about 10 Torr, or between about 0.1 Torr and about 100 Torr, or between about 20 Torr and 200 Torr.

The techniques provided herein may make various adjustments to the processing conditions. In some embodiments, these adjustments may be based on various received measurements, such as measurements of the substrate's temperature and the LEDs. In some other embodiments, these adjustments may be performed in an open loop manner based on empirical or calculated data. In some embodiments, the techniques may follow a similar sequence as in FIGS. 9 and 10, for example. In some other embodiments, the sequence may perform etching or a part of one etching cycle with the substrate at a first temperature, followed by a temperature increase to a higher, second temperature at which another etching cycle, or another portion of the same etching cycle, is performed. After this, the substrate may be actively cooled, and the etching may be repeated on the same substrate or a new substrate.

Figure 11:
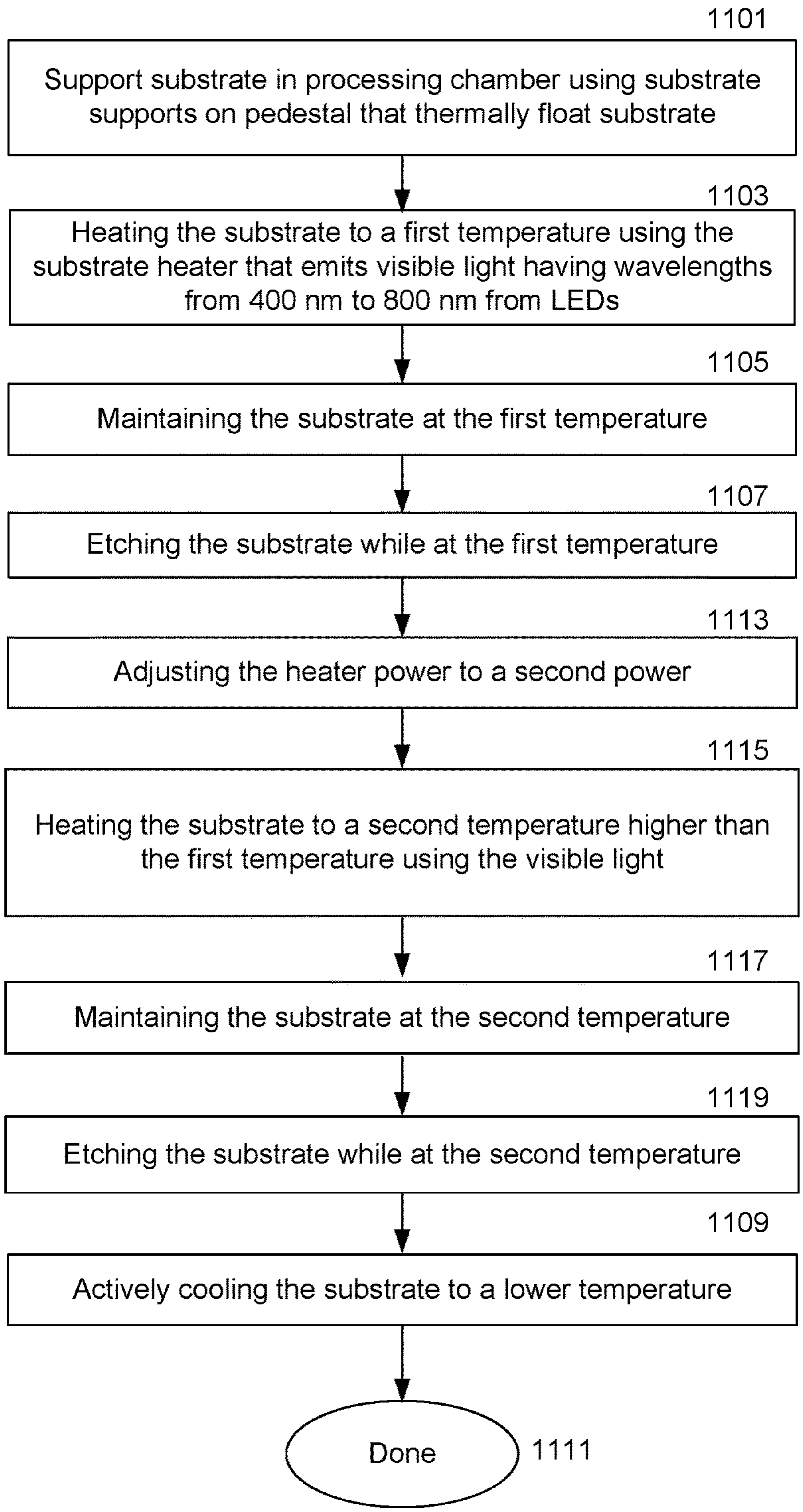
FIG. 11 depicts a second technique for thermal processing in accordance with disclosed embodiments.

FIG. 11 depicts a second technique in accordance with disclosed embodiments. Here, operations 1101 through 1107 are the same as operations 1001 through 1007. After the etching of operation 1007, the heater power is adjusted in operation 1113 to a different power than used during the maintaining of operation 1005 in order to heat the substrate to a second, higher temperature as provided in operation 1115. The substrate's temperature may be maintained at this second temperature during another etching of the substrate as indicated by operations 1117 and 1119. Following these operations, the substrate may be actively cooled in operation 1109. In some instances, the etching operations 1103 through 1109 may be repeated on the same substrate, or on a different substrate.

In some embodiments, the heating and maintaining operations may be based on empirical and measured data, such as empirically derived temperature drift of the apparatus, such as the window of the pedestal. As mentioned above, the window may retain heat throughout processing and act as an independent heater to the substrate. Adjustments may be made to the substrate heater in order to account for this drift, such as decreasing the overall power delivered to the LEDs of the substrate heater during the maintaining and etching operations, such as 1005, 1105, 1007, and 1107. These adjustments may be linear or non-linear, such as stepped or curved. This may also include adjustments to only some of the LEDs, such as to one or more of the independently controlled zones. For example, the center of the window may generate the most heat over time because the heat may not be able to be removed, while the edges of the window generate the least heat because some of this heat is transferred to the pedestal. Accordingly, to maintain uniform heating, one or more independently controllable zones of LEDs in the center of the substrate heater may be lowered to account for the increased heat in the center of the window. This may result in the same heat transferred to the substrate in the center region, with the heat generated by both the window and the substrate heater. Similarly, one or more independently controllable zones of LEDs in the outer region of the substrate heater may be lowered or kept the same to account for any additional heating, if any, caused by the exterior edge of the window.

In some embodiments as mentioned above, each LED may be individually controllable and in some such embodiments, a single LED may be adjusted to emit more or less light than one or more other LEDs. This adjustment may be made to account for a hot or cold spot on the substrate. For example, a spot on the wafer may have a temperature hotter or colder than other portions of the substrate and one LED underneath, or in close proximity to, that spot on the substrate may be adjusted to adjust the temperature at that spot. This may include decreasing the light emitted by the one LED to reduce the temperature at that spot or increasing the light emitted by the one LED to increase the temperature at that spot.

The techniques provided herein may also include feedback control loops for adjusting operating parameters, such as the power of one or more zones of the LEDs. These feedback loops may be implemented during the heating, maintaining, and etching operations described herein. This may include the using one or more of the sensors described herein to determine temperatures at the edge and in one or more locations on the substrate interior and adjust the substrate heater based on these measurements.

Figure 12:
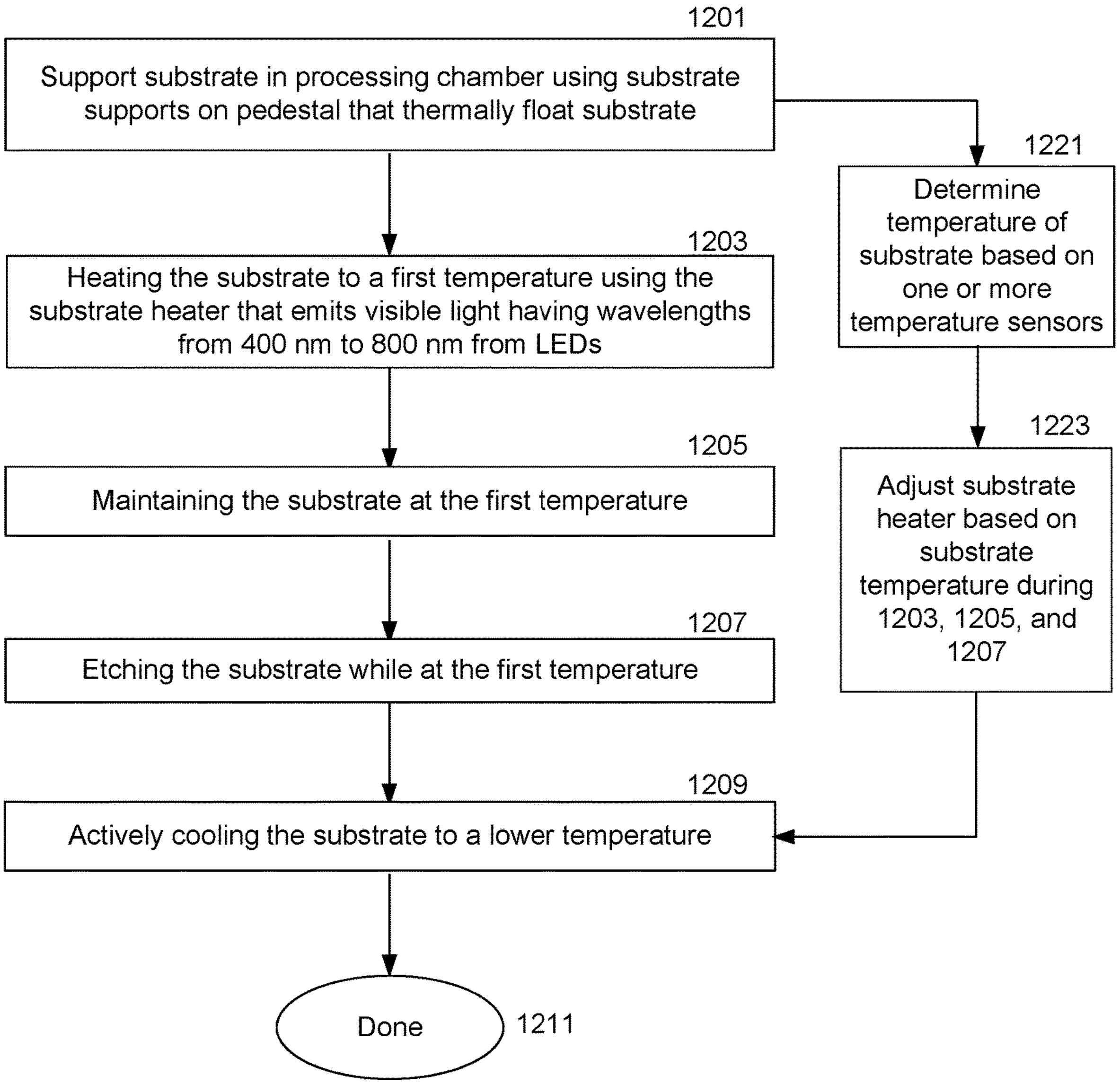
FIG. 12 depicts a third technique for thermal processing in accordance with disclosed embodiments.

FIG. 12 depicts a third technique in accordance with disclosed embodiments. Here, operations 1201 through 1211 are the same as operations 1001 through 1011, except that the technique here measures the substrate temperature during one or more of these operations and adjusts the substrate heater based on these measurements. The temperature measurements are represented by operation 1221 and the adjustment(s) is represented by operation 1223. The adjustments to the substrate heater may include increasing or decrease the power to one or more of the independently controllable zones of LEDs, including all of the LEDs. For instance, the temperature sensors in the substrate supports, as described above with respect to FIG. 5, may indicate that the substrate edge has reached, or is above, the first temperature during one or more of operations 1203, 1205, and 1207, and the power delivered to all of the LEDs may be decreased in order to lower the temperature of the substrate. This may indicate a determination that at least one of the sensors indicates that the temperature of the substrate is above a particular threshold, such as above the first temperature. In another example, only one of the substrate supports may indicate that the substrate temperature is higher than the first temperature and adjustments may be made to independently controllable LED zones around this one sensor to decrease the heat delivered at that location as opposed to the entire substrate.

Similarly, the pyrometer described above may also detect the temperature of the substrate at a location on the substrate, such as its center. This temperature measurement may also be used, alone or in combination with the temperature sensors in the substrate supports, to adjust the substrate heater. For example, the pyrometer may indicate that the substrate center is higher than the first temperature and adjustments may be made to independently controllable LED zones around the center of the substrate, or to the whole substrate, in order to reduce the substrate's temperature at this location. While these examples are made with respect to decreasing power of LEDs, the adjustments are not limited to such examples; the power of one or more independently controllable LED zones may be adjusted to increase the temperature at one or more locations on the substrate.

Another technique may measure the light emitted by the LEDs and adjust one or more independently controllable LED zones based on that measuring. This may include emitting the emitting visible light that has wavelengths between 400 nm and 800 nm from the LEDs, and measuring, using one or more sensors configured to detect the visible light emitted from the plurality of LEDs, one or more metrics of the visible light emitted by the LEDs. These sensors may include a photodetector described above. Based on this measured visible light, the power of one or more LED zones may be adjusted.

Controller

In some embodiments, the apparatuses described herein may include a controller that is configured to control various aspects of the apparatus in order to perform the techniques described herein. For example, referring back to FIG. 1, apparatus 100 includes a controller 131 (which may include one or more physical or logical controllers) that is communicatively connected with and that controls some or all of the operations of a processing chamber. The system controller 131 may include one or more memory devices 133 and one or more processors 135. In some embodiments, the apparatus includes a switching system for controlling flow rates and durations, the substrate heating unit, the substrate cooling unit, the loading and unloading of a substrate in the chamber, the thermal floating of the substrate, and the process gas unit, for instance, when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, the controller 131 is part of an apparatus or a system, which may be part of the above-described examples. Such systems or apparatuses can include semiconductor processing equipment, including a processing tool or tools, chamber or chambers, a platform or platforms for processing, and/or specific processing components (a gas flow system, a substrate heating unit, a substrate cooling unit, etc.). These systems may be integrated with electronics for controlling their operation before, during, and after processing of a semiconductor wafer or substrate. The electronics may be referred to as the "controller," which may control various components or subparts of the system or systems. The controller 966, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 131 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller 131, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 131 receives instructions in the form of data, which specify parameters for each of the processing operations to be performed during one or more operations. It should be understood that the parameters may be specific to the type of process to be performed and the type of tool that the controller is configured to interface with or control. Thus as described above, the controller 131 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

As noted above, depending on the process operation or operations to be performed by the apparatus, the controller 131 might communicate with one or more of other apparatus circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

As also stated above, the controller is configured to perform any technique described above. This may include causing a substrate transfer robot to position the substrate in the chamber on the plurality of substrate supports causing power to be delivered to the LEDs so that they emit the visible light having wavelengths between 400 nm and 800 nm to heat the substrate to a first temperature, such as between 100° C. and 600° C., and causing etchant gases to flow into the chamber and etch the substrate. This may also include cooling, while the substrate is supported by only the plurality of substrate supports, the substrate by flowing the cooling gas onto the substrate, and/or moving the pedestal vertically so that the substrate is offset from a faceplate of a gas distribution unit by a first nonzero distance, and thereby causing heat to transfer from the substrate to the faceplate through noncontact radiation.

While the subject matter disclosed herein has been particularly described with respect to the illustrated embodiments, it will be appreciated that various alterations, modifications and adaptations may be made based on the present disclosure, and are intended to be within the scope of the present invention. It is to be understood that the description is not limited to the disclosed embodiments but, on the contrary, is intended to cover various modifications and equivalent arrangements included within the scope of the claims.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure. For the avoidance of any doubt, it is also to be understood that the above disclosure is at least directed to the following numbered implementations, as well as to other implementations that are evident from the above disclosure.

Implementation 1: An apparatus for semiconductor processing, the apparatus including: a processing chamber including chamber walls that at least partially bound a chamber interior, and a chamber heater configured to heat the chamber walls, a pedestal positioned within the chamber interior and including a substrate heater having a plurality of light emitting diodes (LEDs) configured to emit light with wavelengths in the range of 400 nanometers (nm) and 800 nm, a window positioned above the substrate heater, having a top surface and a bottom surface opposite the top surface that faces the LEDs, and including a material transparent to light with wavelengths in the range of 400 nm and 800 nm, and three or more substrate supports, each substrate having a substrate support surface vertically offset from the window and configured to support a substrate such that the window and the substrate supported by the three or more substrate supports are offset by a nonzero distance, and a gas distribution unit including one or more fluid inlets, a faceplate having a plurality of through-holes fluidically connected to the one or more fluid inlets and to the chamber interior, and having a front surface partially bounding the chamber interior, and a unit heater thermally connected to the faceplate such that heat can be transferred between the faceplate and the unit heater.

Implementation 2: The apparatus of implementation 1, in which each substrate support includes a material transparent to light with wavelengths in the range of 400 nm and 800 nm.

Implementation 3: The apparatus of implementation 1, in which the three or more substrate supports each include quartz.

Implementation 4: The apparatus of implementation 1, in which the substrate support surfaces are positioned closer to a center axis of the window than an outer diameter of the window top surface.

Implementation 5: The apparatus of implementation 1, in which each substrate support includes a temperature sensor configured to detect a temperature of a substrate positioned on the substrate support surface.

Implementation 6: The apparatus of implementation 5, in which the temperature sensor is a thermocouple.

Implementation 7: The apparatus of implementation 1, in which each substrate support surface is vertically offset from the LEDs by a distance of between 1 millimeter and 100 millimeters.

Implementation 8: The apparatus of implementation 1, in which the window includes quartz.

Implementation 9: The apparatus of implementation 8, in which the window further includes a sapphire coating.

Implementation 10: The apparatus of implementation 1, in which the window does not have hole in the center.

Implementation 11: The apparatus of implementation 1, in which the top surface of the window is nonplanar.

Implementation 12: The apparatus of implementation 1, in which the bottom surface of the window is nonplanar.

Implementation 13: The apparatus of implementation 1, in which the bottom surface of the window is in contact with at least a first set of the LEDs.

Implementation 14: The apparatus of implementation 1, in which the pedestal further includes a sidewall, and an outer region of the window is thermally connected to the sidewall such that heat can be transferred between the outer region and the sidewall.

Implementation 15: The apparatus of implementation 1, in which the substrate heater further includes a printed circuit board, by which the LEDs are supported, that includes a reflective material.

Implementation 16: The apparatus of implementation 1, in which the pedestal includes a bowl in which the substrate heater is positioned, the bowl includes one or more sidewalls having an exterior surface that includes reflective material.

Implementation 17: The apparatus of implementation 1, in which the pedestal further includes a pedestal cooler that is thermally connected to the LEDs such that heat can be transferred between the LEDs and the pedestal cooler, includes at least one fluid channel within the pedestal, and is configured to flow a cooling fluid within the at least one fluid channel.

Implementation 18: The apparatus of implementation 17, in which the pedestal further includes a pedestal heater configured to heat one or more exterior surfaces of the pedestal.

Implementation 19: The apparatus of implementation 18, in which the pedestal heater is a resistive heater.

Implementation 20: The apparatus of implementation 1, in which the pedestal includes a fluid inlet and is configured to flow a fluid between the LEDs and the bottom surface of the window.

Implementation 21: The apparatus of implementation 1, in which the pedestal is configured to move vertically.

Implementation 22: The apparatus of implementation 1, in which the pedestal is configured to move vertically to cause a vertical offset gap between the substrate support surfaces of the substrate support and the front surface of the faceplate of between about 2 millimeters (mm) and about 70 mm.

Implementation 23: The apparatus of implementation 1, in which a first set of LEDs are arranged in a first circle having a first radius around a center axis of the substrate heater, and equally spaced apart from each other, and a second set of LEDs are arranged in a second circle having a second radius larger than the first radius around the center axis, and equally spaced apart from each other.

Implementation 24: The apparatus of implementation 1, in which a first set of LEDs are electrically connected to form a first electrical zone, a second set of LEDs are electrically connected to form a second electrical zone, and the first and second electrical zones are independently controllable.

Implementation 25: The apparatus of implementation 1, in which the plurality of LEDs includes more than about 1,000 LEDs, and the plurality of LEDs are grouped to create at least about 80 independently controllable electrical zones.

Implementation 26: The apparatus of implementation 25, in which the plurality of LEDs includes more than about 5,000 LEDs.

Implementation 27: The apparatus of implementation 1, in which each LED is configured to emit visible blue light.

Implementation 28: The apparatus of implementation 1, in which each LED is configured to emit visible white light.

Implementation 29: The apparatus of implementation 1, in which each LED uses about 1.5 watts or less at full power.

Implementation 30: The apparatus of implementation 1, in which each LED uses about 4 watts or less at full power.

Implementation 31: The apparatus of implementation 1, in which each LED is a chip on board LED.

Implementation 32: The apparatus of implementation 1, in which each LED is a surface mounted diode LED.

Implementation 33: The apparatus of implementation 1, in which the gas distribution unit further includes a second unit heater configured to heat the faceplate.

Implementation 34: The apparatus of implementation 33, in which the second unit heater is a resistive heater.

Implementation 35: The apparatus of implementation 1, in which the unit heater includes at least one fluid channel and is configured to flow a heat transfer fluid within the at least one fluid channel.

Implementation 36: The apparatus of implementation 1, further including a mixing plenum fluidically connected to, and upstream of, at least one of the one or more fluid inlets of the gas distribution unit.

Implementation 37: The apparatus of implementation 1, further including one or more sensors configured to measure one or more metrics of the visible light emitted by the LEDs.

Implementation 38: The apparatus of implementation 37, in which the one or more sensors are photodetectors.

Implementation 39: The apparatus of implementation 37, in which the one or more metrics includes the light emitted by the LEDs.

Implementation 40: The apparatus of implementation 1, further including a pyrometer having a detector and an emitter, in which the gas distribution unit includes a port that extends through the faceplate and that includes a sensor window, the emitter or the detector is connected to the port and sensor window through a fiberoptic cable, and the emitter or the detector is positioned in the pedestal and below the window.

Implementation 41: The apparatus of implementation 40, in which the pyrometer is configured to detect emissions having one or more wavelengths of about 1 micron, about 1.1 micron, or between about 1 and about 4 microns.

Implementation 42: The apparatus of implementation 40, in which the pyrometer is configured to detect emissions having wavelengths of about 1 micron, about 1.1 micron, and between about 1 and about 4 microns.

Implementation 43: The apparatus of implementation 40, in which the sensor window is located in a center region of the faceplate.

Implementation 44: The apparatus of implementation 1, in which the chamber walls include aluminum.

Implementation 45: The apparatus of implementation 1, in which the chamber walls include a plastic coating.

Implementation 46: The apparatus of implementation 1, in which the chamber walls include a metal with a yttria coating.

Implementation 47: The apparatus of implementation 1, in which the chamber walls include a metal with a zirconia coating.

Implementation 48: The apparatus of implementation 1, in which the chamber walls include a metal or metal alloy with an aluminum oxide coating.

Implementation 49: The apparatus of implementation 1, further including a vacuum pump configured to evacuate the chamber interior, processing chamber is configured to operate in a pressure range of about 0.1 Torr to about 100 Torr.

Implementation 50: The apparatus of implementation 1, further including a controller having a processor and one or more non-transitory memory devices storing instructions for causing the LEDs to emit the visible light having wavelengths between 400 nm and 800 nm.

Implementation 51: The apparatus of implementation 50, further including a cooling gas source fluidically connected to the one or more fluid inlets, in which the one or more non-transitory memory devices further store instructions for causing the cooling gas to flow onto the substrate.

Implementation 52: The apparatus of implementation 51, in which the pedestal is configured to move vertically, and the one or more non-transitory memory devices further store instructions for causing the pedestal to move vertically and cause the substrate to be offset from the faceplate by a non-zero gap less than or equal to about 5 mm, and the cooling gas is flowed onto the substrate while the substrate is offset from the faceplate by the non-zero gap.

Implementation 53: A method including supporting a substrate in a processing chamber having chamber walls using only a pedestal having a plurality of substrate supports that each contact an edge region of the substrate, heating, while the substrate is supported by only the plurality of substrate supports, the substrate to a first temperature by emitting visible light from a plurality of light emitting diodes (LEDs) under the substrate, in which the visible light has wavelengths between 400 nanometers (nm) and 800 nm, and etching, while the substrate is supported by only the plurality of substrate supports and while the substrate is at the first temperature, a surface of the substrate.

Implementation 54: The method of implementation 53, further including cooling, while the substrate is supported by only the plurality of substrate supports, the substrate by one or more of flowing a cooling gas onto the substrate, and moving the pedestal vertically so that the substrate is offset from a faceplate of a gas distribution unit by a first nonzero offset distance, and thereby causing heat to transfer from the substrate to the faceplate through noncontact radiation.

Implementation 55: The method of implementation 54, in which the cooling is by both flowing the cooling gas and positioning the substrate at the first nonzero offset distance from the faceplate.

Implementation 56: The method of implementation 55, in which the first nonzero offset distance is less than or equal to 5 mm.

Implementation 57: The method of implementation 54, in which the cooling gas includes one or more of hydrogen and helium.

Implementation 58: The method of implementation 53, further including heating, while the substrate is supported by only the plurality of substrate supports, the chamber walls to a second temperature; and heating, while the substrate is supported by only the plurality of substrate supports, a faceplate of a gas distribution unit positioned above the substrate to a third temperature, in which the etching is performed while the chamber walls are heated to the second temperature and the faceplate is heated to the third temperature.

Implementation 59: The method of implementation 58, in which the second temperature and the third temperature are between 30° C. and 150° C.

Implementation 60: The method of implementation 53, in which the supporting, heating, and etching are performed while the processing chamber is at a pressure between about 0.1 Torr and about 100 Torr.

Implementation 61: The method of implementation 53, in which the supporting, heating, and etching are performed while the processing chamber is at a pressure between about 20 Torr and about 200 Torr.

Implementation 62: The method of implementation 53, in which the first temperature is between about 30° C. and about 200° C.

Implementation 63: The method of implementation 53, in which the first temperature is between about 100° C. and about 500° C.

Implementation 64: The method of implementation 53, further including measuring, using one or more temperature sensors, a temperature of the substrate, and adjusting, based on the measuring, a power of at least a first set of the plurality of LEDs during the heating, maintaining, and/or etching.

Implementation 65: The method of implementation 64, in which the one or more temperature sensors include one or more of a temperature sensor in at least one of the substrate supports, and a pyrometer with an emitter configured to emit radiation onto the substrate and a detector configured to receive emissions from the substrate, a temperature of the substrate, in which the detector is configured to detect emissions having one or more wavelengths of about 1 micron, about 1.1 micron, or between about 1 and about 4 microns.

Implementation 66: The method of implementation 65, in which the emitter is configured to detect emissions having wavelengths of about 1 micron, about 1.1 micron, and between about 1 and about 4 microns.

Implementation 67: The method of implementation 65, in which the one or more temperature sensors includes both the temperature sensor in at least one of the substrate supports and the pyrometer.

Implementation 68: The method of implementation 53, further including adjusting a power of at least a first set of the plurality of LEDs, heating, after the adjusting while the substrate is supported by only the plurality of substrate supports, the substrate to a second temperature by emitting visible light from the LEDs, and etching, while the substrate is supported by only the plurality of substrate supports and while the substrate is at the second temperature, a bottom surface of the substrate.

Implementation 69: The method of implementation 68, further including measuring, using one or more temperature sensors, a temperature of the substrate, and the adjusting is performed based, at least in part, on the measuring.

Implementation 70: The method of implementation 69, in which the one or more temperature sensors include one or more of a temperature sensor in at least one of the substrate supports, and a pyrometer with an emitter configured to emit radiation onto the substrate and a receiver configured to receive emissions from the substrate, a temperature of the substrate, in which the detector is configured to detect emissions having one or more wavelengths of about 1 micron, about 1.1 micron, or between about 1 and about 4 microns.

Implementation 71: The method of implementation 70, in which the emitter is configured to detect emissions having wavelengths of about 1 micron, about 1.1 micron, and between about 1 and about 4 microns.

Implementation 72: The method of implementation 70, in which the one or more temperature sensors includes both the temperature sensor in at least one of the substrate supports and the pyrometer.

Implementation 73: The method of implementation 53, in which the supporting further includes supporting the substrate using only a plurality of substrate supports that include a material transparent to visible light having wavelengths between 400 nm and 800 nm.

Implementation 74: A method including emitting visible light from a plurality of light emitting diodes (LEDs) in a processing chamber, in which the visible light has wavelengths between 400 nanometers (nm) and 800 nm, measuring, using one or more sensors configured to detect the visible light emitted from the plurality of LEDs, one or more metrics of the visible light emitted by the LEDs, and adjusting, based at least in part on the measuring, a power of a first set of the plurality of LEDs, in which the first set includes less LEDs than the plurality of LEDs.

Implementation 75: The method of implementation 74, in which the measuring further includes measuring the visible light using a photodetector.

Implementation 76: The method of implementation 75, in which the photodetector is outside the processing chamber that and connected via fiberoptic cable to a port in the processing chamber.

Implementation 77: A pedestal for use in a semiconductor processing chamber, the pedestal including a window having a top surface and a bottom surface opposite the top surface, and including a material transparent to visible light with wavelengths in the range of 400 nm and 800 nm, and three or more substrate supports, each substrate support including a material transparent to visible light with wavelengths in the range of 400 nm and 800 nm, having a substrate support surface configured to support a substrate such that the window and the substrate supported by the three or more substrate are offset by a nonzero distance, and having a temperature sensor configured to detect a temperature of a substrate positioned on the substrate support surface.

Implementation 78: The pedestal of implementation 77, in which the three or more substrate supports each include quartz.

Implementation 79: The pedestal of implementation 77, in which the substrate support surfaces are positioned closer to a center axis of the window than an outer diameter of the window top surface.

Implementation 80: The pedestal of implementation 77, in which each temperature sensor is a thermocouple.

Implementation 81: The pedestal of implementation 77, in which each substrate support surface is vertically offset from the window by a distance between about 5 and about 30 millimeters.

Implementation 82: The pedestal of implementation 77, further including a substrate heater having a plurality of light emitting diodes (LEDs) configured to emit vising light with wavelengths in the range of 400 nm and 800 nm.

Implementation 83: A pedestal for use in a semiconductor processing chamber, the pedestal including a substrate heater having a plurality of light emitting diodes (LEDs) configured to emit vising light with wavelengths in the range of 400 nanometers (nm) and 800 nm, a window having a top surface and a bottom surface opposite the top surface, and including a material transparent to visible light with wavelengths in the range of 400 nm and 800 nm, in which one or more of the top surface and the bottom surface are nonplanar surfaces.

Implementation 84: The pedestal of implementation 83, in which both the top surface and the bottom surface are nonplanar surfaces.

Implementation 85: The pedestal of implementation 83, in which the bottom surface of the window is in contact with at least a first set of the LEDs.

Implementation 86: The pedestal of implementation 83, in which the pedestal further includes a sidewall, and an outer region of the window is thermally connected to the sidewall such that heat can be transferred between the outer region and the sidewall.

Implementation 87: The pedestal of implementation 83, in which the substrate heater further includes a printed circuit board, by which the LEDs are supported, that includes a reflective material.

Implementation 88: The pedestal of implementation 83, in which the pedestal includes a bowl in which the substrate heater is positioned, the bowl includes one or more sidewalls having an exterior surface that includes reflective material.

Implementation 89: The pedestal of implementation 83, in which the pedestal further includes a pedestal cooler that is thermally connected to the LEDs such that heat can be transferred between the LEDs and the pedestal cooler, includes at least one fluid channel within the pedestal, and is configured to flow a cooling fluid within the at least one fluid channel.

Implementation 90: The pedestal of implementation 89, in which the pedestal further includes a pedestal heater configured to heat one or more exterior surfaces of the pedestal.

Implementation 91: The pedestal of implementation 90, in which the pedestal heater is a resistive heater.

Implementation 92: The pedestal of implementation 83, in which the pedestal includes a fluid inlet and is configured to flow a fluid between the LEDs and the bottom surface of the window.

Implementation 93: The pedestal of implementation 83, in which a first set of LEDs are arranged in a first circle having a first radius around a center axis of the substrate heater, and equally spaced apart from each other, and a second set of LEDs are arranged in a second circle having a second radius larger than the first radius around the center axis, and equally spaced apart from each other.

Implementation 94: The pedestal of implementation 83, in which a first set of LEDs are electrically connected to form a first electrical zone, a second set of LEDs are electrically connected to form a second electrical zone, and the first and second electrical zones are independently controllable.

Implementation 95: The pedestal of implementation 83, in which the plurality of LEDs includes more than 1,000 LEDs, and the plurality of LEDs are grouped to create at least about 80 independently controllable electrical zones.

Implementation 96: The pedestal of implementation 95, in which the plurality of LEDs includes more than about 5,000 LEDs.

Implementation 97: The pedestal of implementation 83, in which each LED is configured to emit visible blue light.

Implementation 98: The pedestal of implementation 83, in which each LED is configured to emit visible white light.

Implementation 99: The pedestal of implementation 83, in which each LED uses about 1.5 watts or less at full power.

Implementation 100: The pedestal of implementation 83, in which each LED uses about 4 watts or less at full power.

Implementation 101: The pedestal of implementation 83, in which each LED is a chip on board LED.

Implementation 102: The pedestal of implementation 83, in which each LED is a surface mounted diode LED.

Implementation 103: An apparatus including a processing chamber including chamber walls that at least partially bound a chamber interior, a pedestal positioned within the chamber interior and configured to support a substrate, and a pyrometer having a detector and an emitter, in which the processing chamber includes a port that extends through a surface of the processing chamber that is above the pedestal, and that includes a sensor window, the emitter or the detector is connected to the port and sensor window through a fiberoptic cable, the emitter or the detector is positioned in the pedestal, and the pyrometer is configured to detect emissions having one or more wavelengths of about 1 micron, about 1.1 micron, or between about 1 and about 4 microns.

Implementation 104: The apparatus of implementation 103, in which the pyrometer is configured to detect emissions having wavelengths of about 1 micron, about 1.1 micron, and between about 1 and about 4 microns.

Implementation 105: The apparatus of implementation 103, in which the sensor window is located in a center region of processing chamber.

Implementation 106: The apparatus of implementation 103, in which the processing chamber further includes a gas distribution unit including one or more fluid inlets and a faceplate having a plurality of through-holes fluidically connected to the one or more fluid inlets and to a chamber interior, and having a front surface partially bounding the chamber interior, and the port extends through the front surface of the faceplate.

Implementation 107: The apparatus of implementation 103, further including one or more sensors configured to measure one or more metrics of the visible light emitted by the LEDs.

Implementation 108: The apparatus of implementation 107, in which the one or more sensors are photodetectors.

Implementation 109: The apparatus of implementation 107, in which the one or more metrics includes light emitted by the LEDs.

Implementation 110: A method including supporting a substrate in a processing chamber having chamber walls using only a pedestal having a plurality of substrate supports that each contact an edge region of the substrate, heating, while the substrate is supported by only the plurality of substrate supports, the substrate to a first temperature by emitting visible light from a plurality of light emitting diodes (LEDs) under the substrate, in which the visible light has wavelengths between 400 nanometers (nm) and 800 nm, and cooling, while the substrate is supported by only the plurality of substrate supports, the substrate by one or more of flowing a cooling gas onto the substrate, and moving the pedestal vertically so that the substrate is offset from a faceplate of a gas distribution unit by a first nonzero offset distance less than or equal to 5 mm, and thereby causing heat to transfer from the substrate to the faceplate through noncontact radiation.

Implementation 111: The method of implementation 110, in which the cooling is by flowing the cooling gas onto the substrate.

Implementation 112: The method of implementation 110, in which the cooling is by positioning the substrate at the first nonzero offset distance from the faceplate.

Implementation 113: The method of implementation 110, in which the cooling is by both flowing the cooling gas and positioning the substrate at the first nonzero offset distance from the faceplate.

Implementation 114: The method of implementation 110, in which the cooling gas includes one of or more of hydrogen and helium.

What is claimed is:

1. An apparatus for semiconductor processing, the apparatus comprising:
- a processing chamber including chamber walls that at least partially bound a chamber interior, and a chamber heater configured to heat the chamber walls;
- a pedestal positioned within the chamber interior and including:
  - a substrate heater having a plurality of light emitting diodes (LEDs) configured to emit light with wavelengths in the range of 400 nanometers (nm) and 800 nm,
  - a window positioned above the substrate heater comprising a material transparent to light with wavelengths in the range of 400 nm and 800 nm, and
  - three or more substrate supports, each substrate having a substrate support surface vertically offset from the window and configured to support a substrate such that the window and the substrate supported by the three or more substrate supports are offset by a nonzero distance; and
- a pyrometer having a detector and an emitter, wherein:
  - a top of the processing chamber includes a port that includes a sensor window,
  - the detector is outside the processing chamber and connected to the port and sensor window, and
  - the emitter is positioned in the pedestal and below the window.

2. The apparatus of claim 1, wherein each substrate support comprises a material transparent to light with wavelengths in the range of 400 nm and 800 nm.

3. The apparatus of claim 1, wherein each substrate support includes a temperature sensor configured to detect a temperature of a substrate positioned on the substrate support surface.

4. The apparatus of claim 1, wherein a top surface of the window is nonplanar, and/or a bottom surface of the window is nonplanar.

5. The apparatus of claim 1, wherein:
- the pedestal further includes a sidewall, and
- an outer region of the window is thermally connected to the sidewall such that heat can be transferred between the outer region and the sidewall.

6. The apparatus of claim 1, wherein:
- the pedestal includes a bowl in which the substrate heater is positioned,
- the bowl includes one or more sidewalls having an exterior surface that comprises reflective material.

7. The apparatus of claim 1, wherein the pedestal further comprises a pedestal cooler that:
- is thermally connected to the LEDs such that heat can be transferred between the LEDs and the pedestal cooler,
- includes at least one fluid channel within the pedestal, and
- is configured to flow a cooling fluid within the at least one fluid channel.

8. The apparatus of claim 7, wherein the pedestal further includes a pedestal heater configured to heat one or more exterior surfaces of the pedestal.

9. The apparatus of claim 1, wherein:
- a first set of LEDs are arranged in a first circle having a first radius around a center axis of the substrate heater, and equally spaced apart from each other, and
- a second set of LEDs are arranged in a second circle having a second radius larger than the first radius around the center axis, and equally spaced apart from each other.

10. The apparatus of claim 1, wherein:
- a first set of LEDs are electrically connected to form a first electrical zone,
- a second set of LEDs are electrically connected to form a second electrical zone, and
- the first and second electrical zones are independently controllable.

11. The apparatus of claim 1,
- wherein:
  - the pyrometer further includes a second port that extends through the pedestal and the substrate heater, and
  - the emitter is connected to the second port.

12. The apparatus of claim 1, wherein the pyrometer is configured to detect emissions having one or more wavelengths of about 1 micron, about 1.1 micron, and/or between about 1 and about 4 microns.

13. The apparatus of claim 1, further comprising:
- a gas distribution unit including:
  - one or more fluid inlets, and
  - a faceplate having a plurality of through-holes fluidically connected to the one or more fluid inlets and to the chamber interior, and having a front surface partially bounding the chamber interior; and
- a unit heater thermally connected to the faceplate such that heat can be transferred between the faceplate and the unit heater.

14. The apparatus of claim 13, wherein the port of the pyrometer extends through the gas distribution unit.

15. The apparatus of claim 1, wherein the emitter is below the substrate heater.

16. The apparatus of claim 1, wherein the sensor window is in a center region of the top of the processing chamber.

17. A method comprising:
- supporting a substrate in a processing chamber having chamber walls using only a pedestal having a plurality of substrate supports that each contact an edge region of the substrate;
- heating, while the substrate is supported by only the plurality of substrate supports, the substrate to a first temperature by emitting visible light from a plurality of light emitting diodes (LEDs) under the substrate, wherein the visible light has wavelengths between 400 nanometers (nm) and 800 nm;
- etching, while the substrate is supported by only the plurality of substrate supports and while the substrate is at the first temperature, a surface of the substrate;

measuring, using one or more temperature sensors, a temperature of the substrate, wherein the one or more temperature sensors include a pyrometer having a detector and an emitter, wherein a top of the processing chamber includes a port that includes a sensor window, wherein the detector is outside the processing chamber and connected to the port and sensor window, and wherein the emitter is positioned in the pedestal and below the window; and adjusting, based on the measuring, a power of at least a first set of the plurality of LEDs during the heating, maintaining, and/or etching.

18. The method of claim 17, further comprising:

cooling, while the substrate is supported by only the plurality of substrate supports, the substrate by one or more of:

flowing a cooling gas onto the substrate, and moving the pedestal vertically so that the substrate is offset from a faceplate of a gas distribution unit by a first nonzero offset distance, and thereby causing heat to transfer from the substrate to the faceplate through noncontact radiation.

19. The method of claim 17, further comprising:

heating, while the substrate is supported by only the plurality of substrate supports, the chamber walls to a second temperature; and heating, while the substrate is supported by only the plurality of substrate supports, a faceplate of a gas distribution unit positioned above the substrate to a third temperature, wherein:

the etching is performed while the chamber walls are heated to the second temperature and the faceplate is heated to the third temperature.

20. The method of claim 17, further comprising:

heating, after the adjusting while the substrate is supported by only the plurality of substrate supports, the substrate to a second temperature by emitting visible light from the LEDs; and etching, while the substrate is supported by only the plurality of substrate supports and while the substrate is at the second temperature, a bottom surface of the substrate.

21. A method comprising:

emitting visible light from a plurality of light emitting diodes (LEDs) in a pedestal of a processing chamber, wherein the visible light has wavelengths between 400 nanometers (nm) and 800 nm, and wherein a window is above the LEDs in the pedestal;

measuring, using one or more sensors configured to detect the visible light emitted from the plurality of LEDs, one or more metrics of the visible light emitted by the LEDs, wherein the one or more sensors include a pyrometer having a detector and an emitter, wherein a top of a processing chamber includes a port that includes a sensor window, wherein the detector is outside the processing chamber and connected to the port and sensor window, and wherein the emitter is positioned in the pedestal and below the window; and adjusting, based at least in part on the measuring, a power of a first set of the plurality of LEDs, wherein the first set includes less LEDs than the plurality of LEDs.

22. The method of claim 21, wherein the detector includes a photodetector.

* * * * *